United States Patent
Ueno et al.

(10) Patent No.: US 8,927,099 B2
(45) Date of Patent: Jan. 6, 2015

(54) TRANSITION METAL COMPOUND-CONTAINING NANOPARTICLE AND METHOD FOR PRODUCING THE SAME, INK FOR POSITIVE HOLE INJECTION TRANSPORT LAYER, DEVICE COMPRISING POSITIVE HOLE INJECTION TRANSPORT LAYER AND METHOD FOR PRODUCING THE SAME

(75) Inventors: Shigehiro Ueno, Tokyo-to (JP); Yosuke Taguchi, Tokyo-to (JP); Masaya Shimogawara, Tokyo-to (JP)

(73) Assignee: Dai Nippon Printing Co., Ltd., Tokyo-to (JP)

( * ) Notice: Subject to any disclaimer, the term of this patent is extended or adjusted under 35 U.S.C. 154(b) by 199 days.

(21) Appl. No.: 13/391,652

(22) PCT Filed: Oct. 27, 2010

(86) PCT No.: PCT/JP2010/069087
§ 371 (c)(1),
(2), (4) Date: Feb. 22, 2012

(87) PCT Pub. No.: WO2011/052645
PCT Pub. Date: May 5, 2011

(65) Prior Publication Data
US 2012/0146010 A1 Jun. 14, 2012

(30) Foreign Application Priority Data

Oct. 27, 2009 (JP) .................................. 2009-246903

(51) Int. Cl.
*C09K 11/08* (2006.01)
(Continued)

(52) U.S. Cl.
CPC .............. *H01L 51/5048* (2013.01); *C01G 1/12* (2013.01); *C01G 99/006* (2013.01);
(Continued)

(58) Field of Classification Search
CPC ............ C01G 1/02; C01G 1/12; C01G 31/02; C01G 39/02; C01G 39/06; C01G 47/00; C01G 99/006; C01B 31/34

USPC .................. 428/403, 323, 328; 252/500, 516, 252/518.1, 519.3, 521.5, 301.36
See application file for complete search history.

(56) References Cited

U.S. PATENT DOCUMENTS 4,481,303 A * 11/1984 McIntyre et al. .............. 502/159
4,554,088 A * 11/1985 Whitehead et al. ........ 252/62.54
(Continued)

FOREIGN PATENT DOCUMENTS

JP  09-063771 A   3/1997
JP  11-283750 A  10/1999
(Continued)

OTHER PUBLICATIONS

Chen et al., Recent developments in transition metal carbides and nitrides as hydrogen evolution electrocatalysts, Chem. Commun., 2013, 49, 8896.*

(Continued)

*Primary Examiner* — Holly Le
(74) *Attorney, Agent, or Firm* — Ladas & Parry LLP

(57) ABSTRACT

The present invention is to provide a device capable of having an easy production process and achieving a long lifetime. A device comprising a substrate, two or more electrodes facing each other disposed on the substrate and a positive hole injection transport layer disposed between two electrodes among the two or more electrodes, wherein the positive hole injection transport layer contains a transition metal compound-containing nanoparticle comprising a transition metal compound containing one or more kinds selected from the group consisting of a transition metal carbide oxide, transition metal nitride oxide and transition metal sulfide oxide, wherein a protecting agent having a linking group and a hydrophobic organic group is connected to the transition metal compound by the linking group.

11 Claims, 4 Drawing Sheets

(51) Int. Cl.
*H01B 1/22* (2006.01)
*B32B 5/16* (2006.01)
*H01L 51/50* (2006.01)
*C01G 1/12* (2006.01)
*C01G 39/02* (2006.01)
*C01G 31/02* (2006.01)
*C01G 1/02* (2006.01)
*C01B 31/34* (2006.01)
*C01G 99/00* (2010.01)

(52) U.S. Cl.
CPC ............... *C01G 39/02* (2013.01); *C01G 31/02* (2013.01); *C01G 1/02* (2013.01); *C01B 31/34* (2013.01); *H01L 2251/5369* (2013.01)
USPC ... 428/328; 252/301.36; 252/516; 252/518.1; 252/519.3; 252/521.5; 428/403

(56) References Cited

U.S. PATENT DOCUMENTS

| | | | |
|---|---|---|---|
| 4,695,392 A * | 9/1987 | Whitehead et al. | 252/62.54 |
| 6,797,380 B2 * | 9/2004 | Bonitatebus et al. | 428/842.2 |
| 6,818,329 B1 * | 11/2004 | Liao et al. | 428/690 |
| 7,658,991 B2 * | 2/2010 | Zhao et al. | 428/323 |
| 2005/0147847 A1 * | 7/2005 | Nakamura | 428/690 |
| 2006/0182993 A1 | 8/2006 | Ogata et al. | |
| 2007/0262693 A1 | 11/2007 | Seo et al. | |
| 2009/0072714 A1 | 3/2009 | Suzuki et al. | |
| 2011/0163327 A1 | 7/2011 | Ueno et al. | |
| 2012/0138916 A1 * | 6/2012 | Ueno et al. | 257/40 |

FOREIGN PATENT DOCUMENTS

| | | |
|---|---|---|
| JP | 2000-036390 A | 2/2000 |
| JP | 2002-204012 A | 7/2002 |
| JP | 2005-093427 A | 4/2005 |
| JP | 3-748110 | 12/2005 |
| JP | 2006-155978 A | 6/2006 |
| JP | 2006-156981 A | 6/2006 |
| JP | 2007150226 A | 6/2007 |
| JP | 2007-287586 A | 11/2007 |
| JP | 2007-294261 A | 11/2007 |
| JP | 2008-041894 A | 2/2008 |
| KR | 20080065296 A | 7/2008 |
| KR | 20080095522 A | 10/2008 |
| WO | 2006101018 A1 | 9/2006 |
| WO | 2007/049052 A2 | 5/2007 |
| WO | 2008/061518 A2 | 5/2008 |
| WO | 2009/133907 A1 | 11/2009 |

OTHER PUBLICATIONS

Tsunenori Suzuki, et al; "69.3: Polymer/Metal-Oxide Composite: A Novel Buffer Layer for Solution-Processible OLEDs", SID Symposium Digest of Technical Papers—May 2007—vol. 38, Issue 1, pp. 1840-1843.
International Search Report: mailed Dec. 7, 2010; PCT/JP2010/069087.

* cited by examiner

TRANSITION METAL COMPOUND-CONTAINING NANOPARTICLE AND METHOD FOR PRODUCING THE SAME, INK FOR POSITIVE HOLE INJECTION TRANSPORT LAYER, DEVICE COMPRISING POSITIVE HOLE INJECTION TRANSPORT LAYER AND METHOD FOR PRODUCING THE SAME

TECHNICAL FIELD

The present invention relates to a device comprising a positive hole injection transport layer including an organic device such as an organic electroluminescent element, and a quantum dot light emitting element, a method for producing the same, an ink for the positive hole injection transport layer, and a nanoparticle contained in the positive hole injection transport layer.

BACKGROUND ART

It is expected that a device using an organic substance develops to a wide range of elementary elements such as an organic electroluminescent element (hereinafter referred to as an organic EL element), an organic transistor, an organic solar battery, and an organic semiconductor and uses. In addition to the above devices, devices having a positive hole injection transport layer include a quantum dot light emitting element, an oxide compound solar battery, etc.

An organic EL element is a charge injection type self light emitting device, utilizing the light emission generated at the time of recombining an electron and a positive hole reaching at a light emitting layer. Such an organic EL element has been developed actively since 1987 when T. W. Tang, et al. proved that an element comprising laminated thin films of a fluorescent metal chelate complex and a diamine based molecule emits light of high luminance with a low driving voltage.

The element configuration of the organic EL element comprises a cathode/an organic layer/an anode. The organic layer in an initial organic EL element has a two layer structure comprising a light emitting layer and a positive hole injection layer. At present, however, in order to obtain a high light emitting efficiency and a long driving lifetime, various multilayered structures such as a five layer structure comprising an electron injection layer/an electron transport layer/a light emitting layer/a positive hole transport layer/a positive hole injection layer, etc. have been proposed.

It is said that the layers other than the light emitting layer including the electron injection layer, the electron transport layer, the positive hole transport layer and the positive hole injection layer have effects that charges are easily injected and transported to the light emitting layer, the balance between an electronic current and a positive hole current is maintained by blocking charges, and the diffusion of a light energy exciton is prevented.

For the purpose of improving charge transport ability and charge injection ability, there has been attempts to increase electric conductivity by mixing an oxidizing compound to a positive hole transport material (Patent Literatures 1 and 2).

In Patent Literature 1, as the oxidizing compound, that is, an electron accepting compound, a compound containing counter anions such as a triphenylamine derivative and antimony hexafluoride, and a compound having a significantly-high electron-accepting property, in which a cyano group is bonded to carbon of a carbon-carbon double bond, such as 7,7,8,8-tetracyanoquinodimethane, are used.

In Patent Literature 2, as an oxidizing dopant, a general oxidant can be exemplified, and also halogenated metal, Lewis acid, organic acid and salt of arylamine and halogenated metal or Lewis acid can be exemplified.

In Patent Literatures 3 to 6, as the oxidizing compound, that is, the electron accepting compound, a metal oxide being a compound semiconductor is used. For the purpose of obtaining a positive hole injection layer having an excellent injection property and charge transfer property, for example, a thin film is formed by a vapor deposition method using a metal oxide such as vanadium pentoxide or molybdic trioxide, or a mixed film is formed by codeposition of a molybdenum oxide and an amine based low molecular weight compound.

In Patent Literature 7, a solution, in which oxovanadium (V)tri-1-propoxideoxide is dissolved as the oxidizing compound, that is, the electron accepting compound, is used. As an attempt to form a coating film of vanadium pentoxide, Patent Literature 7 discloses a method for forming a charge transfer complex comprising the step of forming a mixed coating film of the solution and a positive hole transport polymer followed by hydrolysis in water vapor to obtain a vanadium oxide.

Patent Literature 8 discloses that an organic EL element having a long lifetime is produced by dispersing particles produced by physically pulverizing molybdic trioxide in a solution to produce a slurry, and applying the slurry to form a positive hole injection layer, as an attempt to form a coating film of molybdic trioxide.

On the other hand, an organic transistor is a thin film transistor using an organic semiconductor material comprising an organic polymer or an organic low-molecular compound having a n conjugated system for a channel area. A general organic transistor comprises a substrate, a gate electrode, a gate insulating layer, source and drain electrodes and an organic semiconductor layer. In the organic transistor, by changing a voltage (gate voltage) applied to the gate electrode, a quantity of electric charge of an interface of a gate insulating layer and an organic semiconductor layer is controlled and switching is performed by changing a current value between a source electrode and a drain electrode.

As an attempt to improve an on-current value of the organic transistor and stabilize element characteristic by lowering a charge injection barrier between the organic semiconductor layer and the source electrode or the drain electrode, it is known that the carrier density in the organic semiconductor layer in the vicinity of the electrode is increased by introducing the charge transfer complex to an organic semiconductor (for example, Patent Literature 9).

CITATION LIST

Patent Literature

[Patent Literature 1] Japanese Patent Application Laid-Open (JP-A) No. 2000-36390
[Patent Literature 2] JP-A No. H11-283750
[Patent Literature 3] JP-A No. 2006-155978
[Patent Literature 4] JP-A No. 2007-287586
[Patent Literature 5] Japanese patent No. 3748110
[Patent Literature 6] JP-A No. H9-63771
[Patent Literature 7] SID 07 DIGEST p. 1,840 to 1,843 (2007)
[Patent Literature 8] JP-A No. 2008-041894
[Patent Literature 9] JP-A No. 2002-204012

SUMMARY OF INVENTION

Technical Problem

However, even if any of oxidizing materials as disclosed in Patent Literatures 1 to 9 is used as a positive hole transport material, an element having a long lifetime is hardly realized, or the lifetime needs to be further extended. The reason thereof is presumed that oxidizing materials disclosed in Patent Literatures 1, 2, 8 and 9 have a low oxidizing ability toward the positive hole transport material, or low dispersing stability in a thin film. For example, in the case that an oxidizing material comprising a cationic triphenylamine derivative and antimony hexafluoride used in both Patent Literature 1 and Patent Literature 2 is mixed with the positive hole transport material, a charge transfer complex is produced, while the same number of free antimony hexafluoride being a counter anion type as the charge transfer complex is present in a thin film. It is assumed that the free antimony hexafluoride migrates upon driving so that materials partially aggregate and precipitate at the interface with an adjacent layer, thus, the dispersing stability of the material in the thin film upon driving decreases. It is considered that such a change of dispersing stability upon driving changes a carrier injection or transport in the element, therefore, it has an adverse effect on lifetime property. In addition, it is considered that metal oxides disclosed in Patent Literatures 3 to 5 improve positive hole injection property, however, it makes the adhesion of the interface to an adjacent organic compound layer insufficient, thus, the metal oxide has an adverse effect on lifetime property.

In addition, there is a problem that the oxidizing materials as disclosed in Patent Literatures 1 to 9 lack versatility since each of them has insufficient solvent solubility of dissolving at the same time as a positive hole transport polymer compound used to form a film by a solution applying method so that only the oxidizing materials aggregate, and the types of usable solvents are limited. Particularly for a molybdenum oxide being an inorganic compound, there is a problem that although it has a relatively-high property, it is insoluble in a solvent, therefore, the solution applying method cannot be used. For example, Patent Literature 8 discloses that a charge injection layer is produced by a screen printing method using a slurry in which molybdenum oxide particles having an average particle diameter of 20 nm are dispersed in a solvent. However, it is in fact significantly difficult, for example, to produce particles having a uniform particle diameter on a scale of 10 nm or less to satisfy the request for forming a positive hole injection layer having a thickness of about 10 nm by the method of pulverizing $MoO_3$ powder as described in Patent Literature 8. In addition, it is more difficult to stably disperse molybdenum oxide particles produced by pulverization in a solution without aggregation. If the particles are unstably dispersed in a solution, only a film having an unevenness with large difference in height and a poor smoothness can be formed upon forming a coating film, thus, it can cause short circuit of a device. In the case that a thin film can be only formed by a vapor deposition method, there has been a problem of not being able to take advantage of the solution applying method, even if a light emitting layer is formed by separately coating materials by the solution applying method such as an ink-jet method. That is, to avoid impairing liquid repellency of bulkhead (bank) between the light emitting layers by a molybdenum oxide having lyophilicity, the positive hole injection layer or the positive hole transport layer containing the molybdenum oxide being the inorganic compound is required to be deposited using a very fine mask, and it cannot take advantage of the solution applying method from the viewpoint of cost and yield. Further, the molybdenum oxide being the inorganic compound is an oxygen defect type oxide semiconductor, and as for the electric conductivity, $Mo_2O_5$ having an oxidation number of +5 is a better conductor than $MoO_3$ having an oxidation number of +6 at ordinary temperature, however, it is unstable in the air. Therefore, the compound which can be easily deposited by heating is limited to an oxidized compound having a stable valence such as $MoO_3$ or $MoO_2$.

The film-forming property and the stability of the thin film strongly influence the lifetime property of an element. Generally, the lifetime of an organic EL element is defined as the time in which luminance decreases by half when continuous driving at a constant current, and the longer the time in which luminance decreases by half of the element is, the longer the driving lifetime of the element is.

The present invention has been achieved in view of the above problems. A first object of the present invention is to provide a transition metal compound-containing nanoparticle being a material for forming a positive hole injection transport layer by a solution applying method.

A second object of the present invention is to provide a method for producing the transition metal-containing nanoparticle.

A third object of the present invention is to provide a device capable of forming the positive hole injection transport layer by the solution applying method, thus having an easy production process, and capable of achieving a long lifetime.

A fourth object of the present invention is to provide a method for producing the device.

A fifth object of the present invention is to provide an ink for a positive hole injection transport layer for forming the positive hole injection transport layer by the solution applying method.

Solution to Problem

As a result of diligent researches, the inventors of the present invention has found out that by using a transition metal compound-containing nanoparticle, in which a specific transition metal compound is protected with a protecting agent having a hydrophobic organic group, for a positive hole injection transport layer, a positive hole injection transport layer can be formed by a solution applying method, thus a production process is easy, and the positive hole injection transport layer becomes a film having a high stability, which is capable of forming a charge transfer complex, thus improving positive hole injection property, and has an excellent adhesion to an adjacent electrode or organic layer, and the inventors has reached the present invention.

That is, the transition metal compound-containing nanoparticle of the present invention is a transition metal compound-containing nanoparticle comprising a transition metal compound containing one or more kinds selected from the group consisting of a transition metal carbide oxide, transition metal nitride oxide and transition metal sulfide oxide, wherein a protecting agent having a linking group and a hydrophobic organic group is connected to the transition metal compound by the linking group.

Unlike the case of using a molybdenum oxide being an inorganic compound, the transition metal compound-containing nanoparticle (hereinafter, it may be simply referred to as "nanoparticle") of the preset invention is connected to the protecting agent having the hydrophobic organic group by the linking group, so that it has dispersibility to a solvent. Thus, a thin film can be formed by the solution applying method, therefore, there are many advantages of the production process. On a substrate having a liquid-repellent bank, layers from the positive hole injection transport layer to the light emitting layer can be sequentially formed only by a coating process. Therefore, the above coating process is more simple and has an advantage of producing the device at lower cost, compared with the process as in the case of using the molybdenum oxide being the inorganic compound, including after depositing the positive hole injection layer by a vapor deposition using a very fine mask or the like, forming the positive hole transport layer and the light emitting layer by the solution applying method, and further depositing a second electrode.

In addition, unlike the case of using the molybdenum oxide being the inorganic compound, the nanoparticle of the present invention is protected with the protecting agent having the hydrophobic organic group, thus, the compatibility with a positive hole transport compound being an organic substance, and the adhesion of an interface to an adjacent organic layer become excellent. In addition, it can be considered that the transition metal compound contained in the nanoparticle has high reactivity, thus, the nanoparticle easily forms a charge transfer complex. Therefore, the device comprising the positive hole injection transport layer containing the nanoparticle of the present invention can achieve a low voltage driving, a high power efficiency, and a long lifetime.

In addition, by selecting a type of the protecting agent in the nanoparticle, it is easy to multifunctionalize the device of the present invention, including imparting functionalities such as hydrophilicity/hydrophobicity, charge transport property and adhesion.

In the transition metal compound-containing nanoparticle of the present invention, it is preferable that a transition metal in the transition metal compound is one or more kinds of metals selected from the group consisting of molybdenum, tungsten, vanadium and rhenium from the viewpoint of lowering driving voltage and extending an element lifetime.

In the transition metal compound-containing nanoparticle of the present invention, it is preferable that the average particle diameter of the transition metal compound-containing nanoparticle is 0.5 to 20 nm from the viewpoint of being capable of forming a thin film, lowering driving voltage and extending the element lifetime.

In the transition metal compound-containing nanoparticle, it is preferable that the organic group is an aromatic hydrocarbon and/or heterocyclic ring from the viewpoint of further lowering driving voltage and extending the element lifetime.

In the transition metal compound-containing nanoparticle of the present invention, it is preferable that the protecting agent further contains a charge transport group from the viewpoint of further lowering driving voltage and extending the element lifetime.

In the transition metal compound-containing nanoparticle, from the viewpoint of stability of a film, it is preferable that the linking group is one or more kinds selected from functional groups represented by the following formulae (1-a) to (1-n):

[Chemical formula 1]

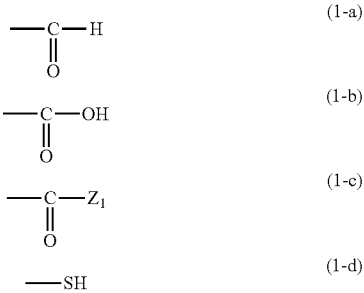

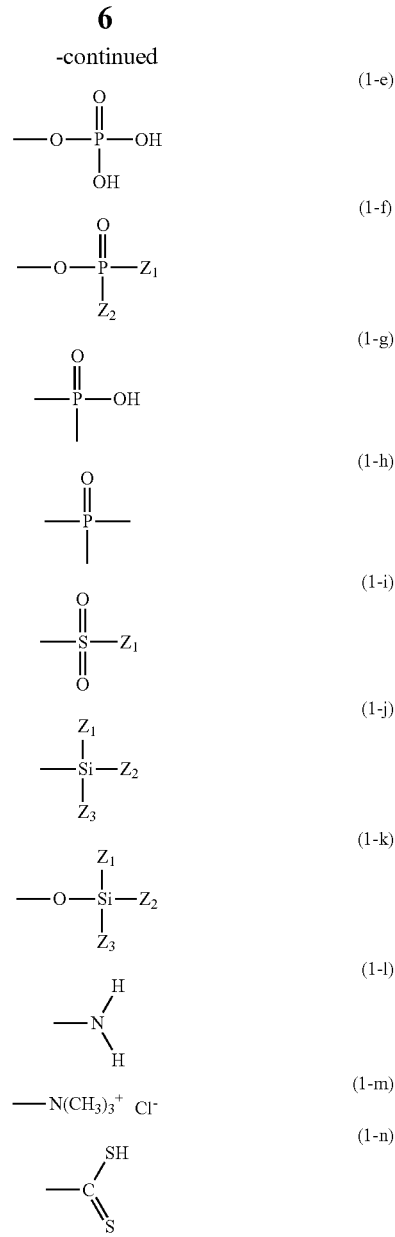

wherein each of $Z_1$, $Z_2$ and $Z_3$ independently represents a halogen atom or an alkoxy group.

The first method for producing the transition metal compound-containing nanoparticle of the present invention comprises: (A) a carbonization step of carbonizing a transition metal and/or transition metal complex to produce a transition metal carbide; (B) a protection step of protecting the transition metal carbide produced in the step (A) with a protecting agent having a hydrophobic organic group; and (C) an oxidation step of oxidizing the transition metal carbide having the organic group produced in the step (B) to produce a transition metal carbide oxide having the organic group.

The second method for producing the transition metal compound-containing nanoparticle comprises: (a) a protection step of protecting a transition metal and/or transition metal complex with a protecting agent having a hydrophobic organic group; (b) a carbonization step of carbonizing the transition metal or transition metal complex having the organic group produced in the step (a) to produce a transition metal carbide having the organic group; and (c) an oxidation step of oxidizing the transition metal carbide having the organic group produced in the step (b) to produce a transition metal carbide oxide having the organic group.

The third method for producing the transition metal compound-containing nanoparticle comprises: (α) a carbonization step of carbonizing a transition metal and/or transition metal complex to produce a transition metal carbide; (β) an oxidation step of oxidizing the transition metal carbide produced in the step (α) to produce a transition metal carbide oxide; and (γ) a protection step of protecting the transition metal carbide oxide produced in the step (β) with a protecting agent having a hydrophobic organic group to produce a transition metal carbide oxide having an organic group.

According to the method for producing the nanoparticle of the present invention, it is possible to obtain a nanoparticle having dispersibility to a solvent and capable of forming a thin film by the solution applying method.

In the first to third methods for producing the transition metal compound-containing nanoparticle, it is preferable that the protection step with the protecting agent is performed in the presence of the organic solvent having a boiling temperature of 200° C. or more from the viewpoint of uniformly and stably performing the protection step under the high temperature.

In the first to third methods for producing the transition metal compound-containing nanoparticle of the present invention, it is preferable that the carbonization step of producing the transition metal carbide is performed at 200 to 400° C. from the viewpoint of uniforming the particle diameter and preventing the generation of unreacted transition metal complex.

In the first to third methods for producing the transition metal compound-containing nanoparticle of the present invention, it is preferable that the carbonization step of producing the transition metal carbide is performed under an argon gas atmosphere from the viewpoint of maintaining dispersing stability in a reaction solution.

The first ink for a positive hole injection transport layer of the present invention comprises said transition metal compound-containing nanoparticle and an organic solvent.

The second ink for a positive hole injection transport layer of the present invention comprises one or more kinds of compounds (C) selected from the group consisting of a transition metal carbide, transition metal nitride and transition metal sulfide, a protecting agent having a linking group and hydrophobic organic group, and an organic solvent.

The device of the present invention comprises a substrate, two or more electrodes facing each other disposed on the substrate and a positive hole injection transport layer disposed between two electrodes among the two or more electrodes, wherein the positive hole injection transport layer contains at least said transition metal compound-containing nanoparticle.

In the device of the present invention, the positive hole injection transport layer may comprise two or more kinds of the transition metal compound-containing nanoparticles which have different kinds of the transition metal respectively.

The device of the present invention is suitably used as an organic EL element containing an organic layer at least having a light emitting layer.

The first method for producing the device of the present invention is a method comprising a substrate, two or more electrodes facing each other disposed on the substrate and a positive hole injection transport layer disposed between two electrodes among the two or more electrodes comprising: a formation step of forming the positive hole injection transport layer on any of the electrodes or on any of layers on the electrodes using the first ink for the positive hole injection transport layer.

The second method for producing the device of the present invention is a method comprising a substrate, two or more electrodes facing each other disposed on the substrate and a positive hole injection transport layer disposed between two electrodes among the two or more electrodes comprising: a formation step of forming the positive hole injection transport layer on any of the electrodes or on any of layers on the electrodes using the second ink for the positive hole injection transport layer; and the oxidation step of oxidizing the compounds (C).

According to the first and second methods for producing the device, it is possible to provide a device capable of forming a positive hole injection transport layer by a solution applying method, thus having an easy production process, and capable of achieving a long lifetime.

In the second method for producing the device of the present invention, the oxidation step of oxidizing the compounds (C) may be performed after the formation step of forming the positive hole injection transport layer.

In the second method for producing the device of the present invention, the oxidation step of oxidizing the compounds (C) may be performed after the preparation step of preparing the ink for the positive hole injection transport layer, and before the formation step of forming the positive hole injection transport layer.

In the second method for producing the device of the present invention, it is preferable to use any of heating means, light irradiation means and means of using active oxygen in the oxidation step of oxidizing the compounds (C).

Advantageous Effects of Invention

The transition metal compound-containing nanoparticle of the present invention has dispersibility to a solvent, and is capable of forming a thin film by a solution applying method.

In the method for producing the transition metal compound-containing nanoparticle of the present invention, such a transition metal compound-containing nanoparticle can be easily produced.

According to the ink for forming the positive hole injection transport layer of the present invention, it is possible to form a positive hole injection transport layer in the device capable of having an easy production process and achieving a long lifetime.

The device of the present invention is capable of having an easy production process and achieving a long lifetime.

According to the method for producing the device of the present invention, it is possible to provide a device capable of having an easy production process and achieving a long lifetime.

DESCRIPTION OF EMBODIMENTS

Figure 1:
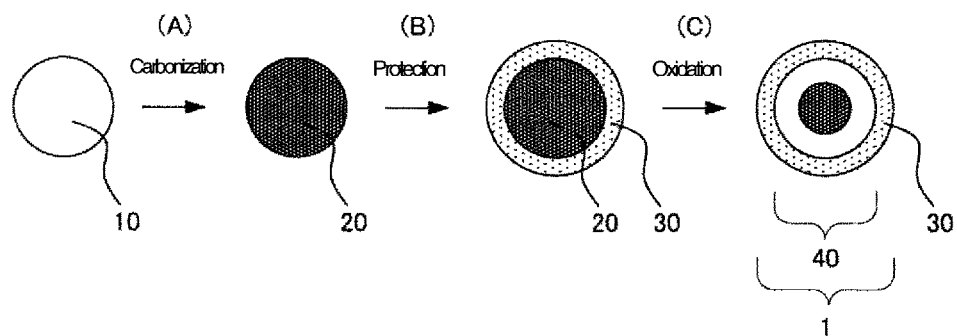
FIG. 1 is a schematical view showing a process of the first to third methods for producing the transition metal compound-containing nanoparticles of the present invention.
Figure 1:
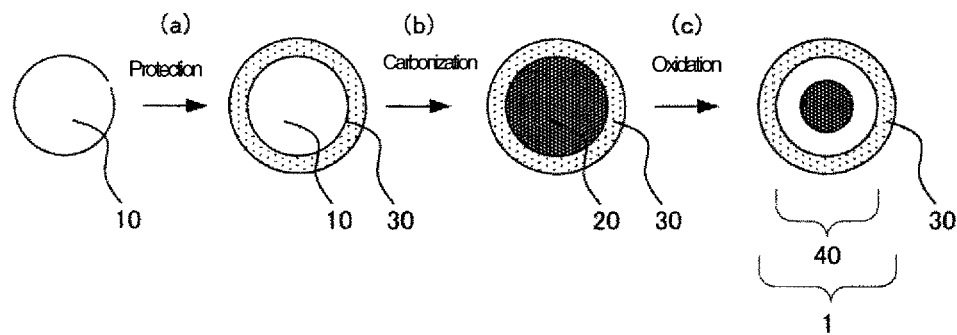
Figure 1:
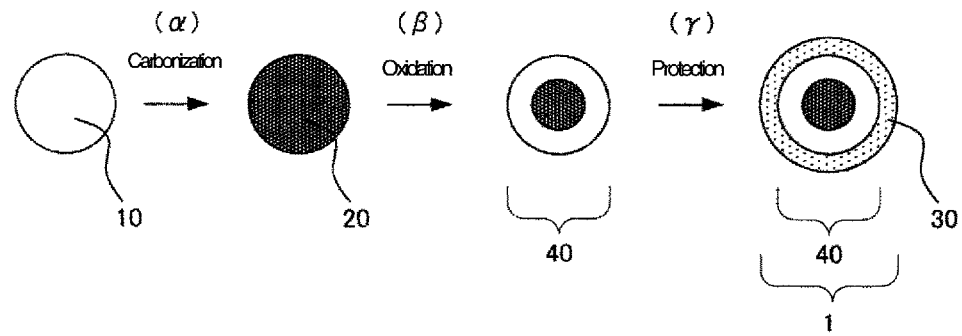

Hereinafter, a transition metal compound-containing nanoparticle of the present invention, a method for producing the same, an ink for a positive hole injection transport layer, a device, and a method for producing the same, will be described.

(Transition Metal Compound-containing Nanoparticle)

The transition metal compound-containing nanoparticle of the present invention is a transition metal compound-containing nanoparticle comprising a transition metal compound containing one or more kinds selected from the group consisting of a transition metal carbide oxide, transition metal nitride oxide and transition metal sulfide oxide, wherein a protecting agent having a linking group and a hydrophobic organic group is connected to the transition metal compound by the linking group.

Unlike the particle formed by merely pulverizing the transition metal oxide as described in Patent Literature 8, the nanoparticle of the present invention has significantly high dispersing stability of the nanoparticle, and can form a thin film having a nanometer order with high uniformity, since a hydrophobic organic group is connected on the surface of the particle as the protecting agent. The thin film has high temporal stability and uniformity, therefore, it is less likely to short out. Furthermore, the thin film has an excellent adhesion to an adjacent electrode or organic layer. Herein, the "nanoparticle" means a particle having a diameter of nm (nanometer) order, that is, a particle having a diameter of less than 1 µm.

The nanoparticle of the present invention may have a single structure or a composite structure, or may also have a core-shell structure, alloy structure or island structure. Examples of the transition metal compound contained in the nanoparticle include one or more kinds selected from the group consisting of a transition metal carbide oxide, transition metal nitride oxide and transition metal sulfide oxide. In addition to the above, the nanoparticle may contain borides, selenides, halides and complexes.

By containing the transition metal carbide oxide, transition metal nitride oxide or transition metal sulfide oxide in the nanoparticle, a value of ionization potential can be further optimized compared with the case that the nanoparticle is simply a transition metal oxide. Also, the change from the metal having an unstable oxidation number of +0 by oxidation can be previously prevented, thus, driving voltage can be lowered and the element lifetime can be extended.

Particularly, it is preferable that the transition metal compounds being oxides having different oxidation numbers are contained together in the nanoparticle. By containing the transition metal compound having a different oxidation number together in the nanoparticle, positive hole transport and positive hole injection properties can be reasonably controlled due to the balance of the oxidation number, thus, the driving voltage can be lowered and the element lifetime can be extended. Transition metal atoms and compounds such as an oxide and a boride having various valences may be contained together in the nanoparticle depending on treatment condition.

In addition, in the transition metal carbide oxide, transition metal nitride oxide and transition metal sulfide oxide, at least a part of the transition metal carbide, transition metal nitride and transition metal sulfide may be oxidized respectively. It is preferable that around 1 nm depth of the surface of the transition metal carbide, transition metal nitride and transition metal sulfide is oxidized respectively.

Specific examples of the transition metal in the transition metal compound contained in the nanoparticle of the present invention include molybdenum, tungsten, vanadium, rhenium, nickel, copper, titanium, platinum, and silver.

Among the above, the transition metal in the transition metal compound is preferably one or more kinds of metals selected from the group consisting of molybdenum, tungsten, vanadium, and rhenium. These metals are preferable from the viewpoint of forming carbide, nitride and sulfide by the redox reaction due to high reactivity and easily forming the charge transfer complex, thus lowering driving voltage and extending the element lifetime.

The amount of the transition metal carbide oxide, transition metal nitride oxide and transition metal sulfide oxide contained in the nanoparticle of the present invention is preferably 90 mol % or more, more preferably 95 mol % or more, still more preferably 100 mol % in the transition metal compound. Furthermore, among the above three kinds of the transition metal compounds, the amount of one of the transition metal compounds is preferably 90 mol % or more, more preferably 95 mol % or more, from the viewpoint of lowering driving voltage and extending the element lifetime.

(Protecting Agent)

In the present invention, the protecting agent which protects the nanoparticle contains a linking group and a hydrophobic organic group.

Since the protecting agent is connected to the nanoparticle by the linking group, and the dispersing stability of the nanoparticle to the organic solvent increases by the protection with the hydrophobic organic group.

The protecting agent may be a low molecular weight compound or a polymer compound.

The linking group is not particularly limited as long as it has a function to connect the transition metal and/or transition metal compound. The type of the linking includes adsorption and coordination, and a chemical bond such as an ion bond or a covalent bond is preferable. The number of the linking group in the protecting agent may be any number as long as one or more linking groups are contained in one molecule. In the case that the transition metal-containing nanoparticle is dispersed in the positive hole transport compound that will be described hereinafter, if two or more linking groups are contained in one molecule of the protecting agent, the protecting agents are polymerized so that the linking group, which has poor compatibility with the positive hole transport compound that will be described hereinafter, is exposed on the positive hole transport compound side being a binder component, thus, the compatibility between the positive hole transport compound and the transition metal-containing nanoparticle may be interrupted. Therefore, in such a case, one linking group is preferably contained in one molecule of the protecting agent.

Examples of the linking group contained in the protecting agent include hydrophilic groups such as a carboxyl group, an amino group, a hydroxyl group, a thiol group, an aldehyde group, a sulfonic acid group, an amide group, a sulfonamide group, a phosphoric acid group, a phosphinic acid group and a P=O group. The linking group is preferably one or more groups selected from the functional groups represented by the following formulae (1-a) to (1-n):

[Chemical formula 2]

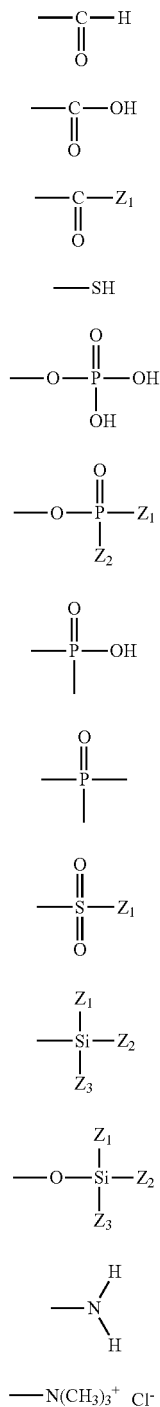

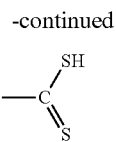

wherein each of $Z_1$, $Z_2$ and $Z_3$ independently represents a halogen atom or an alkoxy group.

Examples of the organic group contained in the protecting agent include a linear or branched and saturated or unsaturated alkyl group having 4 or more carbon atoms, preferably having 6 to 30 carbon atoms, and more preferably having 8 to 20 carbon atoms, and an aromatic hydrocarbon and/or heterocyclic ring. Particularly, the protecting agent preferably contains the linking group, which functions to connect the transition metal and/or transition metal compound, and the aromatic hydrocarbon and/or heterocyclic ring from the viewpoint of improving the dispersing stability of the film and contributing to the achievement of a long driving lifetime due to the improvement of the adhesion to the adjacent organic layer and the compatibility with the positive hole transport compound that will be described hereinafter.

Specific examples of the aromatic hydrocarbon and/or heterocyclic ring include benzene, triphenylamine, fluorene, biphenyl, pyrene, anthracene, carbazole, phenylpyridine, trithiophene, phenyloxadiazole, phenyltriazole, benzimidazole, phenyltriazine, benzodiathiazine, phenylquinoxaline, phenylenevinylene, phenylsilole, and a combination of the above structures.

Unless the effect of the present invention is interfered, the structure containing the aromatic hydrocarbon and/or heterocyclic ring may contain a substituent. Examples of the substituent include a linear or branched alkyl group having 1 to 20 carbon atoms, a halogen atom, an alkoxy group having 1 to 20 carbon atoms, a cyano group, and a nitro group. In the linear or branched alkyl group having 1 to 20 carbon atoms, a linear or branched alkyl group having 1 to 12 carbon atoms, for example, a methyl group, an ethyl group, a propyl group, an isopropyl group, a butyl group, an isobutyl group, a sec-butyl group, a tert-butyl group, a pentyl group, a hexyl group, a heptyl group, an octyl group, a nonyl group, a decyl group, an undecyl group, a dodecyl group, etc. is preferable.

The protecting agent containing fluorine can be also suitably used.

A type of the fluorine-containing organic compound is appropriately selected and is not particularly limited. An example of the fluorine-containing organic compound includes an organic compound obtained by substituting a part or all of hydrogen contained in a linear, branched or cyclic saturated or unsaturated hydrocarbon with fluorine, which may contain a hetero atom other than fluorine. It may be an organic compound obtained by substituting a part or all of hydrogen contained in the organic compound which may contain a hetero atom conventionally used as a positive hole injection transport material with fluorine. Alternatively, it may be a compound obtained by introducing a substituent containing a fluorine-containing organic compound into an organic compound which may contain a hetero atom conventionally used as a positive hole injection transport material.

Specific examples of the fluorine-containing organic compound include a fluorinated alkyl group and a fluorinated aryl group obtained by fluorinating a part or all of hydrogen of a linear, branched or cyclic alkyl group and an aryl group, and a combination of the above groups.

The number of carbon atoms of the fluorinated alkyl group is not particularly limited, and it is preferably 2 to 10, more preferably 4 to 6. Also, the number of carbon atoms of the fluorinated aryl group or a combination of the fluorinated alkyl group and the fluorinated aryl group such as a fluorinated aryl alkyl group is not particularly limited, and it is preferably 6 to 12, more preferably 6 to 9.

Particularly, the fluorinated alkyl group represented by $C_nF_{2n+1}C_mH_{2m}$— [wherein m is an integer of 0 to 20; n is an integer of 1 to 20; and m+n represents 1 to 30] is preferable from the point of view that high oil repellency is maintained and that the stability of the compound is higher in the case where, when m is 1 or more, other element such as an ether bond bonds to the fluorinated alkyl group via $C_mH_{2m}$, rather than the case where other element directly bonds to $C_nF_{2n+1}$. "n" is preferably an integer of 2 to 10, more preferably an integer of 4 to 6. "m" is preferably an integer of 0 to 10, more preferably an integer of 2 to 8.

The fluorination rate of the fluorinated alkyl group (a ratio of fluorine atom in the alkyl group) is preferably 50 to 100%, more preferably 80 to 100%. The perfluoroalkyl group obtained by fully substituting hydrogen atom with fluorine atom is particularly preferable from the point of view that the perfluoroalkyl group exhibits high oil repellency.

The fluorine-containing organic compound containing the aromatic hydrocarbon and/or heterocyclic ring is preferable from the point of view that the boiling point of the fluorine-containing organic compound can be increased. For example, there are advantages that the restriction of the synthesis temperature of the nanoparticle which is protected by the fluorine-containing organic compound can be extended, and the temperature in the high temperature process when producing the device that will be described below can be set high.

Since the aromatic hydrocarbon and/or heterocyclic ring is likely to have charge transport property, charge mobility in the positive hole injection transport layer produced by the fluorine-containing organic compound containing the aromatic hydrocarbon and/or heterocyclic ring can be maintained high. Therefore, there are advantages of high efficiency such as lowering the voltage.

In addition, for example, each layer in the organic device such as the organic EL element generally contains the charge transport material having an aromatic hydrocarbon and/or a heterocyclic ring, thus, it is preferable to contain a structure of the aromatic hydrocarbon and/or heterocyclic ring from the viewpoint of contributing to the achievement of a long driving lifetime in consideration of the improvement in the adhesion between the adjacent organic layer and positive hole injection transport layer.

Examples of the fluorinated alkyl group as the organic group of the fluorine-containing organic compound include the following structures: $CF_3$—, $CF_3CF_2$—, $CHF_2CF_2$—, $CF_3(CF_2)_2$—$CF_3(CF_2)CF_3(CF_2)_4$—, $CF_3(CF_2)_5$—, $CF_3(CF_2)_6$—, $CF_3(CF_2)_7$—, $CF_3(CF_2)_8$—, $CF_3(CF_2)_9$—, $CF_3(CF_2)_{11}$—, $CF_3(CF_2)_{15}$—, $CF_3CH_2CH_2$—, $CF_3CF_2CH_2CH_2$—, $CHF_2CF_2CH_2CH_2$—, $CF_3(CF_2)_2CH_2CH_2$—, $CF_3(CF_2)_3CH_2CH_2$—, $CF_3(CF_2)_4CH_2CH_2$—, $CF_3(CF_2)_5CH_2CH_2$—, $CF_3(CF_2)_6CH_2CH_2$—, $CF_3(CF_2)_7CH_2CH_2$—, $CF_3(CF_2)_8CH_2CH_2$—, $CF_3(CF_2)_9CH_2CH_2$—, $CF_3(CF_2)_{11}CH_2CH_2$—, $CF_3(CF_2)_5CH_2CH_2$—, $CF_3(CF_2)_5O(CF_3)CF$—, $CF_3(CF_2)_2O(CF_3)CFCF_2O(CF_3)CF$—, $CF_3(CF_2)_5O(CF_3)CFCF_2O(CF_3)CFCF_2O(CF_3)CFCF_2O(CF_3)CF$—, and $CF_3(CF_2)_5O(CF_3)CF$—. The structures exemplified above are a linear structure; however, the structures may be a branched structure such as an isopropyl group.

Examples of the organic group of the fluorine-containing organic compound containing the aromatic hydrocarbon and/or heterocyclic ring include pentafluorophenyl group, 2,3,5,6-tetrafluorophenyl group, 3,4,5-trifluorophenyl group, 2,4-difluorophenyl group, 3,4-difluorophenyl group, 3,5-difluorophenyl group, nonafluorobiphenyl group, α,α,α,2,3,5,6-heptafluoro-p-tolyl group, heptafluoronaphthyl group, (trifluoromethyl)phenyl group, 3,5-bis(trifluoromethyl)phenyl group, pentafluorophenylmethyl group, 2,3,5,6-tetrafluorophenylmethyl group, 3,4,5-trifluorophenylmethyl group, 2,4-difluorophenylmethyl group, 3,4-difluorophenylmethyl group, 3,5-difluorophenylmethyl group, nonafluorobiphenylmethyl group, α,α,α,2,3,5,6-heptafluoro-p-tolylmethyl group, heptafluoronaphthylmethyl group, (trifluoromethyl)phenylmethyl group, 3,5-bis(trifluoromethyl)phenylmethyl group, and 4,4',4"-trifluorotrityl group.

It is preferable that the protecting agent contains a charge transport group from the viewpoint of contributing to the achievement of the long driving lifetime due to the improvement of the compatibility with the positive hole transport compound and the charge transport property. The charge transport group is a group which exhibits the property of having drift mobility of an electron or a positive hole due to its chemical structure group, or is defined as a group which can obtain detection current due to charge transport by a known method which can detect charge transport performance such as a Time-Of-Flight method. In the case that the charge transport group cannot exist by itself, it is only necessary to satisfy the condition that a compound in which a hydrogen atom is added to the charge transport group can be a charge transport compound. As the charge transport group, a residue excluding a hydrogen atom in the positive hole transport compound (an arylamine derivative, a carbazole derivative, a thiophene derivative, a fluorene derivative, and a distyryl benzene derivative) that will be described hereinafter can be exemplified.

In the nanoparticle of the present invention, the content ratio of the transition metal compound and the protecting agent is appropriately selected, and is not particularly limited. The amount of the protecting agent is preferably from 10 to 300 parts by weight, more preferably from 10 to 200 parts by weight, still more preferably from 10 to 20 parts by weight, with respect to 100 parts by weight of the transition metal compound.

The average particle diameter of the nanoparticle of the present invention is not particularly limited, and can be, for example, from 0.5 to 999 nm. The average particle diameter is preferably from 0.5 to 50 nm, more preferably from 0.5 to 20 nm, still more preferably 15 nm or less, particularly preferably in the range from 1 to 10 nm. The reason thereof is assumed that if the particle diameter of the nanoparticle is too small, it is difficult to be produced, and to the contrary, if the particle diameter is too large, the surface area (specific surface area) per unit weight decreases, thus, a desired effect may not be obtained, and further, it is likely to short out since the surface roughness of the film increases.

Herein, the average particle diameter means a number average particle size measured by a dynamic light scattering method. In the state that the nanoparticles are dispersed in the positive hole injection transport layer, the average particle diameter is a value obtained by selecting a region where the presence of 20 or more nanoparticles can be confirmed from an image obtained by means of a transmission electron microscope (TEM), and measuring the particle diameters of all nanoparticles in the region to calculate a mean value.

(Method for Producing Transition Metal Compound-containing Nanoparticle)

The method for producing the first transition metal compound-containing nanoparticle of the present invention comprises: (A) a carbonization step of carbonizing a transition metal and/or transition metal complex to produce a transition metal carbide; (B) a protection step of protecting the transition metal carbide produced in the step (A) with a protecting agent having a hydrophobic organic group; and (C) an oxidation step of oxidizing the transition metal carbide having the organic group produced in the step (B) to produce a transition metal carbide oxide having the organic group.

The method for producing the second transition metal compound-containing nanoparticle of the present invention comprises: (a) a protection step of protecting a transition metal and/or transition metal complex with a protecting agent having a hydrophobic organic group; (b) a carbonization step of carbonizing the transition metal or transition metal complex having the organic group produced in the step (a) to produce a transition metal carbide having the organic group; and (c) an oxidation step of oxidizing the transition metal carbide having the organic group produced in the step (b) to produce a transition metal carbide oxide having the organic group.

The method for producing the third transition metal compound-containing nanoparticle of the present invention comprises: ($\alpha$) a carbonization step of carbonizing a transition metal and/or transition metal complex to produce a transition metal carbide; ($\beta$) an oxidation step of oxidizing the transition metal carbide produced in the step ($\alpha$) to produce a transition metal carbide oxide; and ($\gamma$) a protection step of protecting the transition metal carbide oxide produced in the step ($\beta$) with a protecting agent having a hydrophobic organic group to produce a transition metal carbide oxide having an organic group.

FIG. 1 is a schematical view showing a process of a method for producing the first to third transition metal compound-containing nanoparticles of the present invention.

FIG. 1 (*i*) shows an example of the method for producing the first transition metal compound-containing nanoparticle of the present invention, which comprises the steps of: carbonizing transition metal and/or transition metal complex 10 to produce transition metal carbide 20; protecting the surface of the above produced transition metal carbide 20 with protecting agent 30 having a hydrophobic organic group followed by oxidation, thereby obtaining transition metal compound-containing nanoparticle 1.

FIG. 1 (*ii*) shows an example of the method for producing the second transition metal compound-containing nanoparticle of the present invention, which comprises the steps of: protecting the surface of transition metal and/or transition metal complex 10 with protecting agent 30 having a hydrophobic organic group followed by carbonization to produce protected transition metal carbide 20 (having a hydrophobic organic group); and oxidizing the protected transition metal carbide 20, thereby obtaining transition metal compound-containing nanoparticle 1.

FIG. 1 (*iii*) shows an example of the method for producing the third transition metal compound-containing nanoparticle of the present invention, which comprises the steps of: carbonizing transition metal and/or transition metal complex 10 to produce transition metal carbide 20; oxidizing the produced transition metal carbide 20 to produce a transition metal carbide oxide; and protecting the surface of the produced transition metal carbide oxide with protecting agent 30 having a hydrophobic organic group, thereby obtaining transition metal compound-containing nanoparticle 1.

Explanation of the transition metal in the step (A) of the method for producing the first transition metal compound-containing nanoparticle of the present invention is omitted here since it is the same as ones in the above-mentioned nanoparticle.

In the case of carbonizing the transition metal, a ligand containing a carbon atom such as hexacarbonyl or acetylacetonate is added to the transition metal followed by heating or the like, thus, transition metal carbide can be obtained.

The transition metal complex may be a transition metal complex containing the carbon atom in the ligand, and is preferably a transition metal complex which is decomposed in a solvent at the lowest possible temperature. The examples include hexacarbonyl complexes of transition metal such as molybdenumhexacarbonyl, tungstenhexacarbonyl and pentacarbonylchlororhenium, and acetylacetonate complexes of transition metal such as vanadiumacetylacetonate.

As the method for carbonizing the transition metal and/or transition metal complex, methods such as heating, etc. can be used. For example, in the case of heating, the transition metal and/or transition metal complex can be carbonized by heating at 200 to 400° C., preferably at 250 to 350° C.

The step of producing the transition metal carbide is preferably performed under an argon atmosphere from the point of view that dispersing stability is maintained in a reaction solution.

Explanation of the protecting agent in the step (B) is omitted here since it is the same as ones in the above-mentioned nanoparticle.

In the step (B), the protection with the protecting agent having the hydrophobic organic group may be performed, for example, in the presence of the organic solvent. In particular, the protection is performed by heating and agitation in the organic solvent obtained by dispersing the protecting agent. At this time, it is preferable to perform the protection with the protecting agent in the presence of the organic solvent having a boiling temperature of 200° C. or more from the point of view that the protection with the protecting agent can be uniformly and stably performed under the high temperature.

Examples of the oxidation methods in the step (C) include heating means, light irradiation means, and means of using active oxygen, and they may be appropriately used in a combination.

Examples of heating means include a hot plate and an oven. The heating temperature is preferably from 50 to 250° C.

An example of light irradiation means includes an ultraviolet irradiation device.

Examples of means of using active oxygen include a method for using active oxygen generated by ultraviolet, and a method for using active oxygen generated by exposing a photocatalyst such as a titanium oxide or the like to ultraviolet.

In the above means, the heating temperature, the amount of light irradiation and the amount of active oxygen make a difference in the interaction between the nanoparticles, and the interaction of the nanoparticle with the positive hole transport compound, therefore, it is preferable that the heating temperature, the amount of light irradiation and the amount of active oxygen are appropriately adjusted.

Also, in order to efficiently oxidize the transition metal carbide, the oxidation is preferably performed in the presence of oxygen.

In the method for producing the second and third nanoparticles, the carbonization method, oxidation method, and protection method with the protecting agent in the method for producing the first nanoparticle can also be used.

In the method for producing the nanoparticle of the present invention, two or more steps of the said steps in the method for producing the first to third nanoparticles may be performed at the same time.

For example, in the method for producing the first nanoparticle, the carbonization step (A) of carbonizing the transition metal and/or transition metal complex, and the protection step (B) with the protecting agent can be performed at the same time.

In addition, the above-mentioned method for producing the nanoparticle is a method for producing the nanoparticle in the case of containing a transition metal carbide oxide as the transition metal compound. In the case that the nanoparticle contains a transition metal nitride oxide or transition metal sulfide oxide as the transition metal compound, the nanoparticle can be produced similarly as in the above-mentioned method using a material for nitriding or a material for sulfurizing instead of a material for carbonizing which is added to the transition metal, or using a transition metal complex containing a nitrogen atom or sulfur atom instead of the transition metal complex containing the carbon atom.

Examples of the material for sulfurizing to be added upon sulfurizing the transition metal include sulfur, dodecanethiol, benzenethiol and bistrimethylsilylated sulfur.

Examples of the transition metal complex containing the nitrogen atom include tungsten pentacarbonyl-N-pentyl-isonitrile and triaminemolybdenum tricarbonyl.

(Ink for Positive Hole Injection Transport Layer)

The first ink for the positive hole injection transport layer of the present invention comprises the transition metal compound-containing nanoparticle and an organic solvent.

The second ink for the positive hole injection transport layer of the present invention comprises one or more kinds of compounds (C) selected from the group consisting of a transition metal carbide, transition metal nitride and transition metal sulfide, a protecting agent having a linking group and hydrophobic organic group, and an organic solvent.

According to the first and second inks for the positive hole injection transport layer, it is possible to provide a device capable of having the easy production process and achieving the long lifetime.

Explanations of the transition metal compound-containing nanoparticle contained in the first ink for the positive hole injection transport layer and the protecting agent contained in the second ink for the positive hole injection transport layer are omitted here since they are the same as ones in the nanoparticle.

(Compound (C))

One or more kinds of the compounds (C) selected from the group consisting of the transition metal carbide, transition metal nitride and transition metal sulfide contained in the second ink for the positive hole injection transport layer are precursors of the transition metal carbide oxide, transition metal nitride oxide and transition metal sulfide oxide described in the nanoparticle. By oxidizing the precursors, corresponding oxides are obtained.

In each of the compounds (C), at least a part of the transition metal and/or transition metal complex can be carbonized, nitrided or sulfurized.

As the method for obtaining the transition metal carbide, a known method can be used. For example, the method for carbonizing the transition metal described in the method for producing the first nanoparticle can be used.

In addition, in the case of obtaining the transition metal nitride and transition metal sulfide, for example, as described in the method for producing the first nanoparticle, the method for carbonizing the transition metal can be performed using a material for nitriding or a material for sulfurizing instead of a material for carbonizing which is added to the transition metal, or using a transition metal complex containing a nitrogen atom or sulfur atom instead of the transition metal complex containing the carbon atom.

(Organic Solvent)

The organic solvent contained in the first ink for the positive hole injection transport layer is not particularly limited as long as the transition metal compound-containing nanoparticle, if necessary, the protecting agent and other components such as the positive hole transport compound, etc. that will be described hereinafter can be dissolved or dispersed in the solvent. Also, the organic solvent contained in the second ink for the positive hole injection transport layer is not particularly limited as long as the compound (C), if necessary, the protecting agent and other components such as the positive hole transport compound, etc. that will be described hereinafter can be dissolved or dispersed in the solvent.

Examples of such an organic solvent include toluene, xylene, dodecylbenzene, cyclohexanone, cyclohexanol, tetralin, mesitylene, anisole, methylene chloride, tetrahydrofuran, dichloroethane, chloroform, ethyl benzoate and butyl benzoate.

(Positive Hole Transport Compound)

Each of the first and second inks for the positive hole injection transport layer preferably comprise a positive hole transport compound other than the above-mentioned essential components, from the viewpoint of lowering driving voltage of the positive hole injection transport layer and further extending the element lifetime.

As the positive hole transport compound, a compound having positive hole transport property can be appropriately used. The positive hole transport property as used herein means that overcurrent by positive hole transport is observed by a known photocurrent method.

As the positive hole transport compound, a polymer compound is suitably used besides a low molecular weight compound. A positive hole transport polymer compound means a polymer compound having the positive hole transport property and a weight-average molecular weight of 2,000 or more in terms of polystyrene by gel permeation chromatography. In the ink for the positive hole injection transport layer of the present invention, as a positive hole transport material, it is preferable to use a polymer compound easily soluble in the organic solvent and capable of forming a stable coating film in which compounds to be contained hardly aggregates, from the viewpoint of forming a stable film by the solution applying method.

The positive hole transport compound is not particularly limited, and the examples include arylamine derivatives, anthracene derivatives, carbazole derivatives, thiophene derivatives, fluorene derivatives, distyryl benzene derivatives, and Spiro compounds.

Examples of the arylamine derivatives include N,N'-bis-(3-methylphenyl)-N,N'-bis-(phenyl)-benzidine (TPD), bis (N-(1-naphthyl-N-phenyl)benzidine) (α-NPD), 4,4',4''-tris (3-methylphenylphenylamino)triphenylamine (MTDATA), and 4,4',4''-tris(N-(2-naphthyl)-N-phenylamino)triphenylamine (2-TNATA).

Examples of the carbazole derivatives include 4,4-N,N'-dicarbazole-biphenyl (CBP), etc.

Examples of the fluorene derivatives include N,N'-bis(3-methylphenyl)-N,N'-bis(phenyl)-9,9-dimethylfluorene (DMFL-TPD), etc.

Examples of the distyryl benzene derivatives include 4-(di-p-tolylamino)-4'-[(di-p-tolylamino)styryl]stilbene (DPAVB), etc.

Examples of the Spiro compounds include 2,7-bis(N-naphthalene-1-yl-N-phenylamino)-9,9-spirobifluorene (Spiro-NPB), and 2,2',7,7'-tetrakis(N,N-diphenylamino)-9,9'-spirobifluorene (Spiro-TAD).

In addition, as the positive hole transport polymer compound, a polymer containing an arylamine derivative, an anthracene derivative, a carbazole derivative, a thiophene derivative, a fluorene derivative, a distyryl benzene derivative, or a spiro compound in a repeating unit can be exemplified.

Specific examples of the polymers containing the arylamine derivative in the repeating unit include non-conjugated polymers such as copoly[3,3'-hydroxy-tetraphenylbenzidine/diethylene glycol]carbonate (PC-TPD-DEG), PTPDES and Et-PTPDEK represented by the structures described below, and conjugated polymers such as poly[N,N'-bis(4-butylphenyl)-N,N'-bis(phenyl)-benzidine].

Specific examples of the polymers containing the anthracene derivative in the repeating unit include poly[(9,9-dioctylfluorenyl-2,7-diyl)-co-(9,10-anthracene)], etc.

Specific examples of the polymers containing the carbazole in the repeating unit include polyvinylcarbazole (PVK), etc.

Specific examples of the polymers containing the thiophene derivative in the repeating unit include poly[(9,9-dioctylfluorenyl-2,7-diyl)-co-(bithiophene)], etc.

Specific examples of the polymers containing the fluorene derivative in the repeating unit include poly[(9,9-dioctylfluorenyl-2,7-diyl)-co-(4,4'-(N-(4-sec-butylphenyl))diphenylamine)] (TFB), etc.

Specific examples of the polymers containing the Spiro compound in the repeating unit include poly[(9,9-dioctylfluorenyl-2,7-diyl)-alt-co-(9,9'-spiro-bifluorene-2,7-diyl)], etc.

These positive hole transport polymer compounds may be used alone or in combination of two or more kinds.

ing 4 or more and 60 or less carbon atoms relating to the conjugated bond; "n" is 0 to 10,000; "m" is 0 to 10,000; "n+m" is 10 to 20,000; and the arrangement of two repeating units is arbitrarily selected.

The arrangement of two repeating units in the above formula (2) is arbitrarily selected. For example, it may be any of a random copolymer, alternative copolymer, periodic copolymer and block copolymer.

The average of "n" is preferably from 5 to 5,000, more preferably from 10 to 3,000. The average of "m" is preferably from 5 to 5,000, more preferably from 10 to 3,000. In addition, the average of "n+m" is preferably from 10 to 10,000, more preferably from 20 to 6,000.

In $Ar_1$ to $Ar_4$ of the above formula (2), specific examples of an aromatic hydrocarbon in the aromatic hydrocarbon group include benzene, fluorene, naphthalene, anthracene, a combination thereof, derivatives thereof, phenylenevinylene derivatives, and styryl derivatives. In addition, specific examples of a heterocyclic ring in the heterocyclic group include thiophene, pyridine, pyrrole, carbazole, a combination thereof, and derivatives thereof.

[Chemical formula 3]

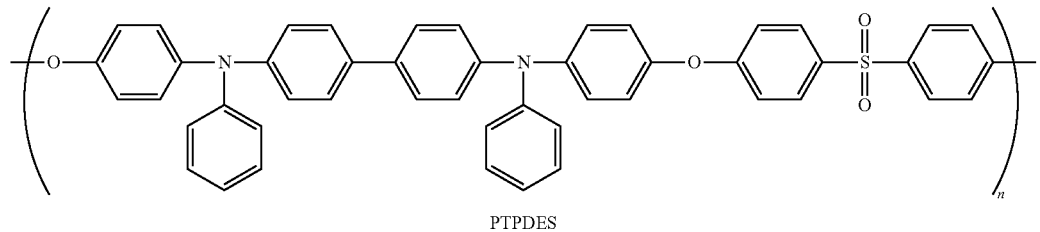

PTPDES

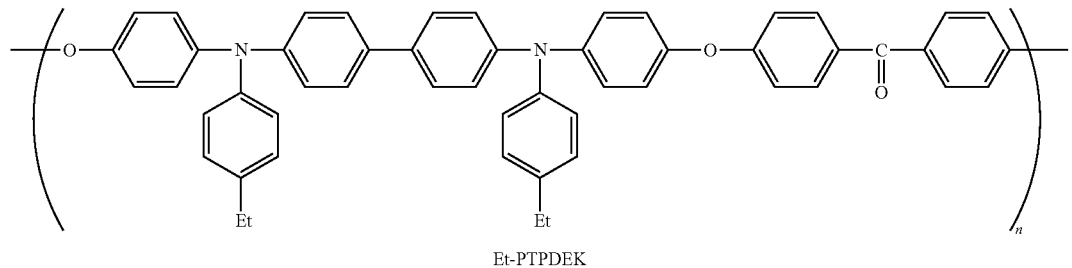

Et-PTPDEK

Among the above, it is preferable that the positive hole transport polymer compound is a compound represented by the following formula (2) from the viewpoint of obtaining good stability of adhesion to the adjacent organic layer and having the HOMO energy value between an anode substrate and a light emitting layer material.

[Chemical formula 4]

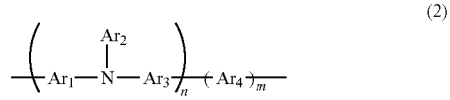
(2)

wherein $Ar_1$ to $Ar_4$ may be the same or different from each other; each of $Ar_1$ to $Ar_4$ represents an unsubstituted or substituted aromatic hydrocarbon group comprising 6 or more and 60 or less carbon atoms relating to a conjugated bond, or an unsubstituted or substituted heterocyclic group compris- In the case that $Ar_1$ to $Ar_4$ of the above formula (2) have a substituent, the substituent is preferably a linear or branched alkyl group or alkenyl group having 1 to 12 carbon atoms, such as a methyl group, an ethyl group, a propyl group, an isopropyl group, a butyl group, an isobutyl group, a sec-butyl group, a tert-butyl group, a pentyl group, a hexyl group, a heptyl group, an octyl group, a nonyl group, a decyl group, an undecyl group, a dodecyl group, a vinyl group, and an allyl group.

Preferable specific examples of the compound represented by the above formula (2) include poly[(9,9-dioctylfluorenyl-2,7-diyl)-co-(4,4'-(N-(4-sec-butylphenyl))diphenylamine)] (TFB) represented by the following formula (3), poly[(9,9-dioctylfluorenyl-2,7-diyl)-alt-co-(N,N'-bis{4-butylphenyl}-benzidine N,N'-{1,4-diphenylene})] represented by the following formula (4), and poly[(9,9-dioctylfluorenyl-2,7-diyl)] (PFO) represented by the following formula (5).

[Chemical formula 5]

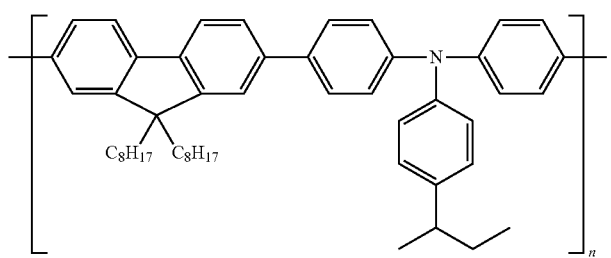

(3)

[Chemical formula 6]

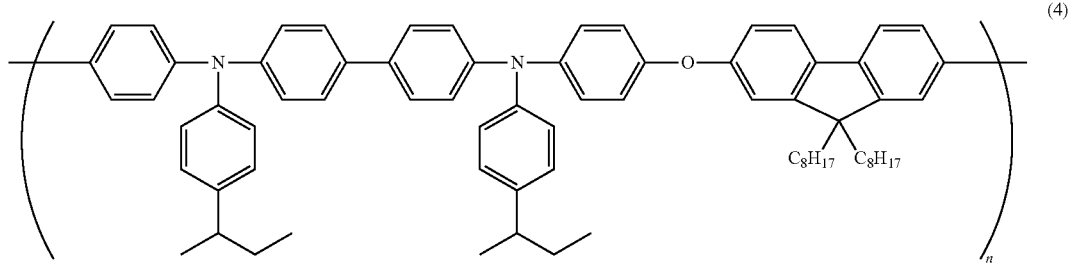

(4)

[Chemical formula 7]

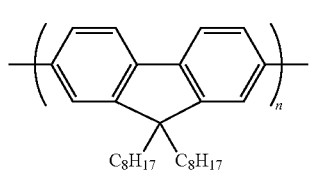

(5)

If the positive hole transport compound is the compound represented by the above formula (2), as the protecting agent of the nanoparticle, the compound represented by the following formula (6) can be suitably used.

[Chemical formula 8]

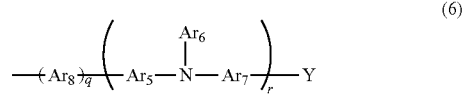

(6)

wherein $Ar_5$ to $Ar_8$ may be the same or different from each other; each of $Ar_5$ to $Ar_8$ represents an unsubstituted or substituted aromatic hydrocarbon group comprising 6 or more and 60 or less carbon atoms relating to a conjugated bond, or an unsubstituted or substituted heterocyclic group comprising 4 or more and 60 or less carbon atoms relating to the conjugated bond; "q" is 0 to 10; "r" is 0 to 10; "q+r" is 1 to 20; the arrangement of two repeating units is arbitrarily selected; and "Y" represents a linking group.

In $Ar_5$ to $Ar_8$ of the above formula (6), specific examples of an aromatic hydrocarbon in the aromatic hydrocarbon group include benzene, fluorene, naphthalene, anthracene, a combination thereof, derivatives thereof, phenylenevinylene derivatives, and styryl derivatives. In addition, specific examples of a heterocyclic ring in the heterocyclic group include thiophene, pyridine, pyrrole, carbazole, a combination thereof, and derivatives thereof. $Ar_5$ to $Ar_8$ may have a substituent similar to the substituent of $Ar_1$ to $Ar_4$ of the above formula (2).

In the formula (6), it is preferable that a combination of $Ar_5$, $Ar_6$ and $Ar_7$ and/or $Ar_8$ has at least the same skeleton of the aromatic hydrocarbon group or the heterocyclic group as those of a combination of $Ar_1$, $Ar_2$ and $Ar_3$ and/or any of $Ar_1$, $Ar_2$, $Ar_3$ and $Ar_4$ in formula (2).

In the case of using the positive hole transport compound in the ink for the positive hole injection transport layer, the content of the positive hole transport compound is preferably from 10 to 10,000 parts by weight with respect to 100 parts by weight of the transition metal-containing nanoparticle from the viewpoint of improving the positive hole injection transport property and achieving a long lifetime due to high stability of a film.

If the content of the positive hole transport compound in the positive hole injection transport layer is too low, it may be difficult to obtain the synergistic effect of having the positive hole transport compound mixed. On the other hand, if the content of the positive hole transport compound is too high, it becomes difficult to obtain the effect of using the transition metal-containing nanoparticle.

Unless the effect of the present invention is interfered, the ink for the positive hole injection transport layer of the present invention may contain an additive such as a binder resin, a curable resin or a coating property improver.

Examples of the binder resin include a polycarbonate, a polystyrene, a polyarylate, and a polyester, and a binder resin which can be cured by heat or light may be contained. As the material which can be cured by heat or light, the positive hole transport compound having a curable functional group in the molecule or a curable resin can be used. Specific examples of the curable functional group include acrylic functional groups such as an acryloyl group and a methacryloyl group; a vinylene group; an epoxy group; and an isocyanate group.

The curable resin may be a thermosetting resin or photo-curable resin, and the examples include an epoxy resin, a phenol resin, a melamine resin, a polyester resin, a polyurethane resin, a silicone resin, and a silane coupling agent.

The first ink for the positive hole injection transport layer is generally prepared by mixing the nanoparticle being the essential components, and the optional components such as the positive hole transport compound in an organic solvent to disperse in accordance with a general preparation method. The second ink for the positive hole injection transport layer is generally prepared by mixing one or more kinds of the compounds (C) selected from the group consisting of the transition metal carbide, transition metal nitride and transition metal sulfide and the protecting agent having the linking group and hydrophobic organic group being the essential components, and optional components such as the positive hole transport compound in an organic solvent to disperse in accordance with a general preparation method. A paint shaker or a beadsmill can be used for mixing and dispersing.

(Device)

A device of the present invention comprises a substrate, two or more electrodes facing each other disposed on the substrate and a positive hole injection transport layer disposed between two electrodes among the two or more electrodes, wherein the positive hole injection transport layer contains at least the transition metal compound-containing nanoparticle.

The device of the present invention can achieve a long lifetime of an element since the positive hole injection transport layer can be a film having a high stability, which improves positive hole injection property, and has an excellent adhesion to an adjacent electrode or organic layer by containing the nanoparticle. In addition, unlike the case of using the transition metal oxide being the inorganic compound, the device of the present invention can form a thin film by the solution applying method, therefore, it is possible to have an easy production process since the device of the present invention comprises the nanoparticle containing an organic group as the protecting agent which protects the surface of the particle and having dispersibility to a solvent.

As described above, the nanoparticle used for the device of the present invention can extend its lifetime. The reason thereof is presumed that the transition metal compound such as the transition metal carbide oxide, transition metal nitride oxide and transition metal sulfide oxide contained in the nanoparticle has high reactivity, and a charge transfer complex is easily formed between the nanoparticles or between the nanoparticle and the positive hole transport compound If the positive hole transport compound is contained.

Unlike the transition metal oxide being the inorganic compound, the nanoparticle contains an organic group in the nanoparticle as the protecting agent, thus, the compatibility with the positive hole transport compound being the organic substance, and the adhesion of an interface to an adjacent organic layer becomes excellent. Therefore, it is presumed that the device comprising the positive hole injection transport layer containing the nanoparticle of the present invention can achieve a low voltage driving, a high power efficiency, and a particularly long lifetime.

In the device of the present invention, by selecting a type of the protecting agent of the nanoparticle, it is easy to multi-functionalize the device of the present invention, including imparting functionalities such as hydrophilicity/hydrophobicity, charge transport property, and adhesion.

Since the device of the present invention can form the positive hole injection transport layer by the solution applying method, layers from the positive hole injection transport layer to the light emitting layer can be sequentially formed on a substrate having a liquid-repellent bank only by a coating process. Therefore, the above coating process is more simple and has an advantage of producing the device at lower cost compared with a process as in the case of the transition metal oxide being the inorganic compound including after depositing the positive hole injection layer by a vapor deposition using a very fine mask or the like, forming the positive hole transport layer and the light emitting layer by the solution applying method, and further depositing a second electrode.

The formation of the charge transfer complex can be suggested by the phenomenon observed by the 1H NMR measurement, for example, in which the shape of proton signal and a chemical shift value derived from the aromatic ring observed around 6 to 10 ppm regarding a charge transport compound change after the nanoparticle is mixed with a solution of the charge transport compound compared with those before the nanoparticle is mixed with the solution of the charge transport compound.

Hereinafter, a constitution of layers of the device of the present invention will be described.

The device of the present invention comprises a substrate, two or more electrodes facing each other disposed on the substrate and a positive hole injection transport layer disposed between two electrodes among the two or more electrodes.

The device of the present invention includes organic devices such as an organic EL element, an organic transistor, a dye-sensitized solar battery, an organic thin film solar battery, and an organic semiconductor, and even includes a quantum dot light emitting element and an oxide compound solar battery having the positive hole injection transport layer.

Figure 2:
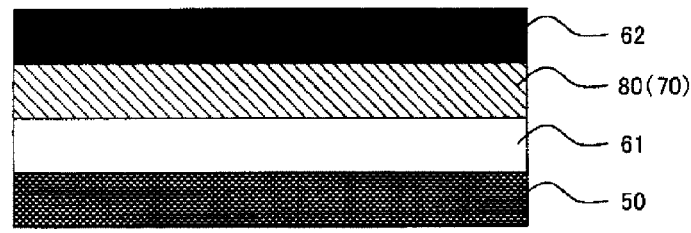
FIG. 2 is a sectional schematic diagram showing a basic constitution of layers of the device of the present invention.

FIG. 2 is a schematic sectional view showing a basic constitution of layers of the organic device of the present invention. The basic constitution of layers of the device of the present invention comprises two electrodes (61 and 62) facing each other disposed on substrate 50, and organic layer 80 containing at least positive hole injection transport layer 70 disposed between the two electrodes (61 and 62).

Substrate 50 is a support medium for forming layers constituting the device. It is not required for the substrate 50 to be disposed on the surface of the electrode 61, and may be disposed on the outermost surface of the device.

Positive hole injection transport layer 70 is a layer containing at least the nanoparticle and performing a function of injecting and/or transporting a positive hole from electrode 61 to organic layer 80.

Organic layer 80 is a layer which exhibits various functions depending on a type of the device by injecting and transporting the positive hole, and may comprise a single layer or two or more layers. In the case that the organic layer comprises two or more layers, the organic layer contains the positive hole injection transport layer, and further contains a layer which plays a central role in the function of the device (hereinafter, it will be referred to as a functional layer), and a layer which plays a supplementary role of the functional layer (hereinafter, it will be referred to as a supplementary layer). For example, in the case of the organic EL element, the positive hole transport layer further laminated on the surface of the positive hole injection transport layer corresponds to the supplementary layer, and the light emitting layer laminated on the surface of the positive hole transport layer corresponds to the functional layer.

Electrode 62 is disposed in a position where organic layer 80 containing positive hole injection transport layer 70 exists between electrode 62 and electrode 61 facing each other. In addition, if necessary, the device may have a third electrode, which is not shown in the figures. By applying an electric field to layers between the electrodes, the function of the device can be exhibited.

Figure 3:
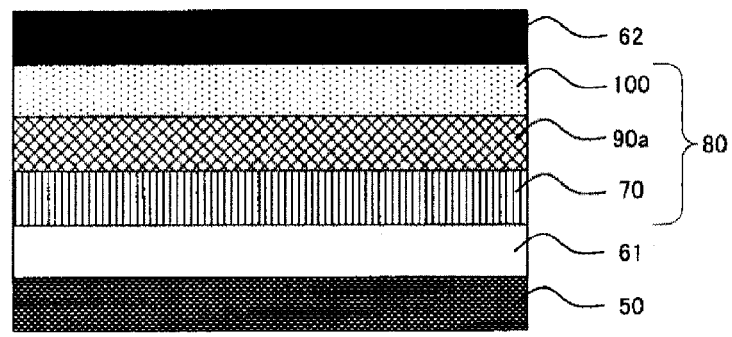
FIG. 3 is a schematic sectional view showing an example of a constitution of layers of the organic EL element being one embodiment of the device of the present invention.

FIG. 3 is a schematic sectional view showing an example of the constitution of layers of the organic EL element being one embodiment of the device of the present invention. The organic EL element of the present invention has an embodiment in which positive hole injection transport layer 70 is laminated on the surface of electrode 61, and positive hole transport layer 90a and light emitting layer 100 are laminated on the surface of positive hole injection transport layer 70 as the supplementary layer and the functional layer respectively. In the case of using the positive hole injection transport layer characterized in the present invention at a position of the positive hole injection layer as above, the positive hole injection transport layer forms a charge transfer complex to be insoluble in the solvent used for the solution applying method in addition to improvement in electroconductivity, thus, it is possible to apply the solution applying method when the positive hole transport layer is laminated on the positive hole injection transport layer. Furthermore, the improvement in the adhesion to the electrode can be expected.

Figure 4:
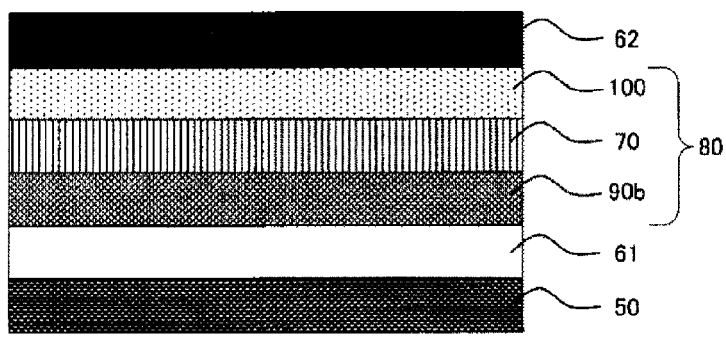
FIG. 4 is a schematic sectional view showing one of other examples of the constitution of layers of the organic EL element being one embodiment of the device of the present invention.

FIG. 4 is a schematic sectional view showing one of other examples of the constitution of layers of the organic EL element being one embodiment of the device of the present invention. The organic EL element of the present invention has an embodiment in which positive hole injection layer 90b is formed on the surface of electrode 61 as the supplementary layer, and positive hole injection transport layer 70 and light emitting layer 100 as the functional layer are laminated on the surface of positive hole injection layer 90b. In the case of using the positive hole injection transport layer characterized in the present invention in a position of the positive hole transport layer as above, the positive hole injection transport layer forms the charge transfer complex to be insoluble in the solvent used for the solution applying method in addition to improvement in electroconductivity, thus, it is possible to apply the solution applying method when the light emitting layer is laminated on the positive hole injection transport layer.

Figure 5:
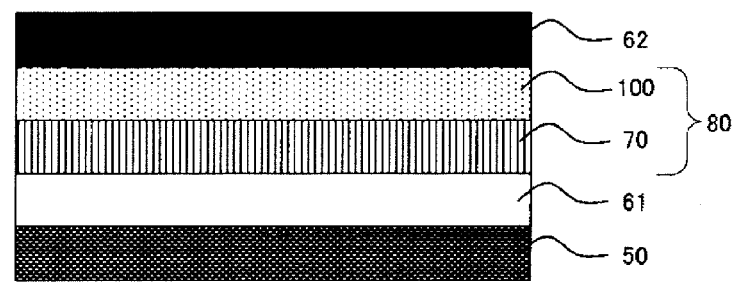
FIG. 5 is a schematic sectional view showing one of other examples of the constitution of layers of the organic EL element being one embodiment of the device of the present invention.

FIG. 5 is a schematic sectional view showing one of other examples of the constitution of layers of the organic EL element being one embodiment of the device of the present invention. The organic EL element of the present invention has an embodiment in which positive hole injection transport layer 70 and light emitting layer 100 as the functional layer are laminated on the surface of electrode 61 in this order. In the case that the positive hole injection transport layer characterized in the present invention is used as a single layer as above, there is an advantage of reducing the number of steps in the process.

In FIGS. 3 to 5, each of positive hole injection transport layer 70, positive hole transport layer 90a, and positive hole injection layer 90b may be constituted not by a single layer but by two or more layers.

In FIGS. 3 to 5, electrode 61 functions as an anode and electrode 62 functions as a cathode. The organic EL element has a function that, if the electric field is applied between the anode and cathode, the positive hole is injected from the anode to the light emitting layer 100 through positive hole injection transport layer 70 and positive hole transport layer 90a, and the electron is injected from the cathode to the light emitting layer, thus, recombining of the injected positive hole and electron is performed in the light emitting layer 100 to emit light to the outside of the element.

In order to emit the light to the outside of the element, at least all layers on one surface of the light emitting layer are required to have permeability to the light of at least a part of wavelength in a visible wavelength range. In addition, if necessary, an electron transport layer and/or an electron injection layer may be disposed between the light emitting layer and electrode 62 (cathode) (not shown in figures).

Figure 6:
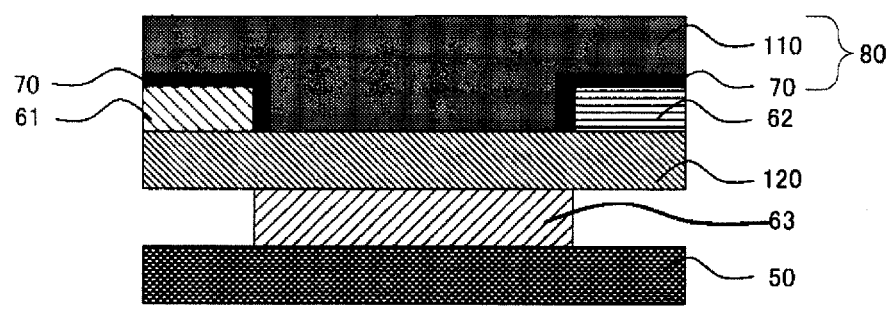
FIG. 6 is a schematic sectional view showing an example of a constitution of layers of the organic transistor being another embodiment of the device of the present invention.

FIG. 6 is a schematic sectional view showing an example of the constitution of layers of the organic transistor being another embodiment of the device of the present invention. The organic transistor comprises electrode 63 (gate electrode), electrode 61 (source electrode) and electrode 62 (drain electrode) facing each other, organic semiconductor layer 110 as the organic layer disposed between electrode 63, electrode 61 and electrode 62, and insulating layer 120 interposed between electrode 63 and electrode 61, and electrode 63 and electrode 61 on substrate 50, and positive hole injection transport layer 70 is formed on the surfaces of electrode 61 and electrode 62.

The above organic transistor has a function of controlling currents between the source electrode and drain electrode by controlling the accumulation of the charges in the gate electrode.

Figure 7:
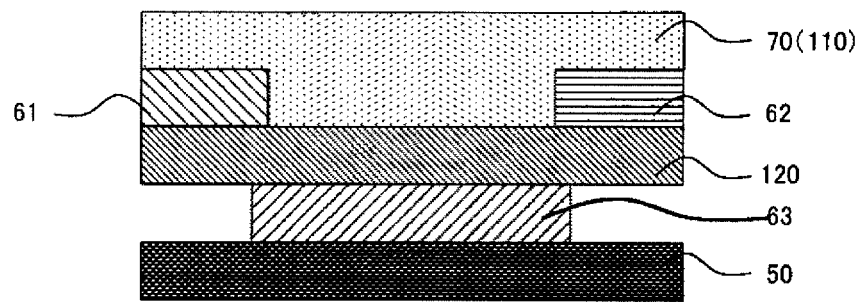
FIG. 7 is a schematic sectional view showing one of other examples of the constitution of layers of the organic transistor being another embodiment of the device of the present invention.

FIG. 7 is a schematic sectional view showing an example of another constitution of layers of the organic transistor being the embodiment of the device of the present invention. The organic transistor comprises electrode 63 (gate electrode), electrode 61 (source electrode) and electrode 62 (drain electrode) facing each other, organic semiconductor layer 110 consisting of positive hole injection transport layer 70 of the present invention being formed as the organic layer disposed between electrode 63, electrode 61 and electrode 62, and insulating layer 120 interposed between electrode 63 and electrode 61, and electrode 63 and electrode 62 on substrate 50. In this example, positive hole injection transport layer 70 functions as organic semiconductor layer 110.

The constitution of layers of the device of the present invention is not limited to the above examples, and one having a constitution substantially as same as the technical idea disclosed in claims of the present invention and providing similar function effects is included in the technical scope of the present invention.

Hereinafter, each layer of the device of the present invention will be described in detail.
(Positive Hole Injection Transport Layer)

The device of the present invention contains at least the positive hole injection transport layer. In the case that the device of the present invention is an organic device and the organic layer comprises two or more layers, the organic layer contains the positive hole injection transport layer, and further contains a layer which plays a central role in the function of the device, and a supplementary layer which plays a supplementary role in supporting the functional layer. The functional layer and the supplementary layer will be described in detail in the specific example of the device that will be hereinafter described.

The positive hole injection transport layer of the device of the present invention is formed by using the above-mentioned ink for the positive hole injection transport layer, and contains at least a nanoparticle. The positive hole injection transport layer of the device of the present invention may comprise only the nanoparticle, but may further contain other components. In particular, it is preferable that the positive hole injection transport layer contains the positive hole transport compound from the viewpoint of lowering driving voltage and further extending an element lifetime.

In the case that the positive hole injection transport layer of the device of the present invention further contains the positive hole transport compound, the positive hole injection transport layer of the device of the present invention may comprise only a mixed layer containing the nanoparticle and the positive hole transport compound, or may comprise two or more layers including the mixed layer. In addition, the positive hole injection transport layer may comprise two or more layers in which a layer containing the nanoparticle and a layer containing the positive hole transport compound are laminated. Furthermore, the positive hole injection transport layer may be a layer in which at least a layer containing the nanoparticle and a layer containing at least the nanoparticle and the positive hole transport compound are laminated.

The positive hole injection transport layer of the present invention may comprise two or more kinds of the transition metal compound-containing nanoparticles having different kinds of the transition metal respectively.

The film thickness of the positive hole injection transport layer can be appropriately determined according to the purpose or an adjacent layer thereof, and is generally from 0.1 to 1,000 nm, preferably from 1 to 500 nm.

In addition, the work function of the positive hole injection transport layer is preferably from 5.0 to 6.0 eV, more preferably from 5.0 to 5.8 eV, from the viewpoint of positive hole injection efficiency.

The positive hole injection transport layer of the present invention can be formed by the solution applying method. It is preferable that the positive hole injection transport layer of the present invention is formed by the solution applying method from the viewpoint of easy production process and high yield since it is less likely to short out, and achieving a long lifetime due to formation of a charge transfer complex. In this case, the positive hole injection transport layer of the present invention is formed by the solution applying method using a solution (ink for forming a positive hole injection transport layer) dispersing the nanoparticle in the solvent in which at least the nanoparticle is suitably dispersed. In addition, in the case of forming the positive hole injection transport layer containing the positive hole transport compound, the positive hole injection transport layer may be formed by the solution applying method using a solution in which the nanoparticle and the positive hole transport compound are mixed in the solvent in which both the above nanoparticle and the compound are suitably dissolved or dispersed. In this case, if the nanoparticle and the positive hole transport compound are mixed in the solvent in which both the nanoparticle and the positive hole transport compound are suitably dissolved or dispersed, the nanoparticle and the positive hole transport compound are interacted each other and the charge transfer complex is easily formed, thus, the positive hole injection transport layer having an excellent positive hole transport property and temporal stability of a film can be formed. As described above, the positive hole injection transport layer which forms the charge transfer complex tends to be insoluble in the solvent used when the positive hole injection transport layer is formed, therefore, even in the case of forming the organic layer which corresponds to the layer on the positive hole injection transport layer, a possibility of using the solution applying method can be expanded without eluting the positive hole injection transport layer.

The solution applying method will be described in "Method for producing device" described hereinafter.

(Substrate)

The substrate is a support medium of the device of the present invention. The material of the substrate may be, for example, a flexible material or a hard material. Examples of the material which can be specifically used include a glass, a quartz, a polyethylene, a polypropylene, a polyethylene a terephthalate, a polymethacrylate, a polymethylmethacrylate, a polymethylacrylate, a polyester, and a polycarbonate.

Among the above, in the case of using a substrate made of a synthetic resin, it preferably has gas barrier property. The thickness of the substrate is not particularly limited, and is generally from around 0.5 to 2.0 mm.

(Electrode)

The device of the present invention comprises the substrate, and two or more electrodes facing each other disposed on the substrate.

In the device of the present invention, the electrode is preferably formed of a metal or a metal oxide, and a known material can be appropriately employed. Generally, the electrode can be formed of a metal such as aluminum, gold, silver, nickel, palladium or platinum, or a metal oxide such as an oxide of indium and/or tin, etc.

Generally, there are many cases that the electrode is formed on the substrate by a method such as a sputtering method or a vacuum vapor deposition method, however, it can be formed by a wet process such as a coating method or a dip method. The thickness of the electrode varies depending on transparency or the like required for each electrode. If the transparency is required, the light transmittance in a visible light wavelength region of the electrode is generally 60% or more, preferably 80% or more. In this case, the thickness of the electrode is generally from about 10 to 1,000 nm, preferably from about 20 to 500 nm.

In the present invention, the device may further comprise a metal layer on the electrode to improve the stability of adhesion to a charge injection material. The metal layer means a layer containing a metal, and is formed of the metal or the metal oxide generally used for the electrode described above.

(Others)

The device of the present invention may comprise a known electron injection layer and/or electron transport layer, if necessary, between an electron injection electrode and the positive hole injection transport layer.

(Organic EL Element)

As an embodiment of the device of the present invention, an organic EL element comprising the organic layer containing at least the positive hole injection transport layer of the present invention and the light emitting layer can be exemplified.

Hereinafter, layers which constitute the organic EL element will be described in order using FIGS. 3 to 5.

(Substrate)

Substrate 50 is a support medium of the organic EL element. The material of the substrate may be, for example, a flexible material or a hard material. Specifically, for example, one described in "Substrate" for the device can be used.

If light emitted at light emitting layer 100 transmits substrate 50 side and is taken therefrom, at least substrate 50 is required to be a transparent material.

(Anode and Cathode)

Either electrode 61 or electrode 62 is required to have transparency depending on the direction that light emitted at light emitting layer 100 is taken. Electrode 61 needs to be formed of a transparent material if light is taken from substrate 50 side, and electrode 62 needs to be formed of a transparent material if light is taken from electrode 62 side.

Electrode 61 disposed on the light emitting layer side of substrate 50 functions as an anode which injects a positive hole to the light emitting layer, and electrode 62 disposed on the light emitting layer side of substrate 50 functions as a cathode which injects an electron to light emitting layer 100.

In the present invention, it is preferable that the anode and cathode are formed of the metal or metal oxide described in "Electrode" for the device described above.

(Positive Hole Injection Transport Layer, Positive Hole Transport Layer, and Positive Hole Injection Layer)

As shown in FIGS. 3 to 5, positive hole injection transport layer 70, positive hole transport layer 90*a*, and positive hole injection layer 90*b* are appropriately formed between light emitting layer 100 and electrode 61 (anode). As shown in FIG. 3, positive hole transport layer 90*a* is laminated on positive hole injection transport layer 70 of the present invention, and light emitting layer 100 may be laminated thereon. As shown in FIG. 4, positive hole injection transport layer 70 of the present invention is laminated on positive hole injection layer 90*b*, and light emitting layer 100 may be laminated thereon. As shown in FIG. 5, positive hole injection transport layer 70 of the present invention is laminated on electrode 61, and light emitting layer 100 is laminated thereon.

As shown in FIG. 3, in the case that positive hole transport layer 90*a* is laminated on positive hole injection transport layer 70 of the present invention, a positive hole transport material used for positive hole transport layer 90*a* is not particularly limited, and the positive hole transport compound described in "Positive hole injection transport layer" of the present invention is preferably used. Among the above, it is preferable to use a compound similar to the positive hole transport compound used for the adjacent positive hole injection transport layer 70 of the present invention from the viewpoint of improving the stability of adhesion of the interface between the positive hole injection transport layer and the positive hole transport layer, and contributing to the achievement of a long driving lifetime.

The positive hole transport layer 90*a* can be formed of the positive hole transport material by a method similar to that of the light emitting layer that will be described hereinafter. The thickness of the positive hole transport layer 90*a* is generally from 0.1 to 1 μm, preferably from 1 to 500 nm.

As shown in FIG. 4, in the case that positive hole injection transport layer 70 of the present invention is laminated on positive hole injection layer 90*b*, a positive hole injection material used for positive hole injection layer 90*b* is not particularly limited, and a known compound can be used. Examples of the compound include phenylamines; starburst-type amines; phthalocyanines; oxides such as a vanadium oxide, a molybdenum oxide, a ruthenium oxide and an aluminum oxide; amorphous carbon; and derivatives of polyaniline and polythiophene.

Positive hole injection layer 90*b* can be formed of the positive hole injection material by a method similar to that of light emitting layer 100 that will be described hereinafter. The thickness of positive hole injection layer 90*b* is generally from 1 nm to 1 μm, preferably from 2 to 500 nm, more preferably from 5 to 200 nm.

Furthermore, considering positive hole injection property, it is preferable that the positive hole injection material and positive hole transport material may be selected so as to make the value of work function (HOMO) of each layer larger in a stepwise fashion from electrode 61 side to light emitting layer 100 being an organic layer so that an energy barrier of the positive hole injection at each interface reduces as much as possible, and a large energy barrier of the positive hole injection between electrode 61 and light emitting layer 100 is supplemented.

Specifically, for example, in the case that ITO (work function 5.0 eV right after UV ozon cleaning) is used for electrode 61, and Alq3 (HOMO 5.7 eV) is used for light emitting layer 100, it is preferable that a mixture of TFB (work function 5.4 eV) and a nanoparticle (work function 5.0 to 5.7 eV) is selected as a material constituting positive hole injection transport layer 70, and layers are arranged so as to have a layer constitution in which the value of the work function of each layer is sequentially larger from electrode 61 side to light emitting layer 100. The value measured by photoelectron spectroscopy by means of a photoelectron spectrometer (product name: AC-1; manufactured by: Riken Keiki Co., Ltd.) is used for the value of the work function or HOMO described above.

In the case of such a layer constitution, the large energy barrier of the positive hole injection between electrode 61 (work function 5.0 eV right after UV ozon cleaning) and light emitting layer 100 (for example, HOMO 5.7 eV) can be supplemented so that the vales of HOMO become stepwise. Therefore, the positive hole injection transport layer having an excellent positive hole injection efficiency can be obtained.

(Light Emitting Layer)

As shown in FIGS. 3 to 5, light emitting layer 100 is formed of an emitting material between substrate 50 on which electrode 61 is formed and electrode 62.

The material used for the light emitting layer of the present invention is not particularly limited as long as it is generally used for the emitting material, and either a fluorescent material or a phosphorescent material can be used. More specifically, materials such as a dye based light emitting material and a metal complex based light emitting material can be exemplified, and either a low molecular weight compound or a polymer compound can be used.

Examples of the dye based light emitting material include arylamine derivatives, anthracene derivatives, (phenylanthracene derivatives), oxadiazole derivatives, oxazole derivatives, oligothiophene derivatives, carbazole derivatives, cyclopentadiene derivatives, silole derivatives, distyryl benzene derivatives, distyryl pyrazine derivatives, distyryl arylene derivatives, silole derivatives, stilbene derivatives, spiro compounds, thiophene ring compounds, tetraphenylbutadiene derivatives, triazole derivatives, triphenylamine derivatives, trifumanylamine derivatives, pyrazoloquinoline derivatives, hydrazone derivatives, pyrazoline dimers, pyridine ring compounds, fluorene derivatives, phenanthrolines, perinone derivatives, and perylene derivatives. In addition, a dimer, trimer or oligomer thereof, or a compound containing two or more kinds of derivatives can be used.

These materials may be used alone or in combination of two or more kinds.

Examples of the metal complex based light emitting material include an aluminum quinolinol complex, a benzoquinolinol beryllium complex, a benzoxazole zinc complex, a benzothiazole zinc complex, an azomethyl zinc complex, a porphyrin zinc complex, and an europium complex; and a metal complex which has a central metal including Al, Zn, Be or the like or a rare-earth metal such as Tb, Eu, Dy, and has a ligand such as oxadiazole, thiadiazole, phenylpyridine, phenylbenzimidazole, and quinoline structure.

These materials may be used alone or in combination of two or more kinds.

As the polymer light emitting material, a polymer or a dendrimer in which the above low molecular weight material is introduced in a molecule as a straight chain, a side chain, or a functional group can be used.

The examples include poly p-phenylenevinylene derivatives, polythiophene derivatives, poly p-phenylene derivatives, polysilane derivatives, polyacetylene derivatives, polyvinylcarbazole derivatives, polyfluorenone derivatives, polyfluorene derivatives, polyquinoxaline derivatives, and copolymers thereof.

A doping material may be added in the light emitting layer for the purpose of improving light emitting efficiency or changing a light emitting wavelength. In the case of a polymer material, the doping material may be contained in a molecular structure as a light emitting group. Examples of such a doping material include perylene derivatives, coumarin derivatives, rubrene derivatives, quinacridone derivatives, squarylium derivatives, porphyrin derivatives, a styryl dye, tetracene derivatives, pyrazoline derivatives, decacyclene, phenoxazone, quinoxaline derivatives, carbazole derivatives, and fluorene derivatives. In addition, a compound in which a spiro group is introduced to one of the above derivatives can be used.

These materials may be used alone or in combination of two or more kinds.

In the present invention, as the material for the light emitting layer, either a low molecular weight compound or a polymer compound which emits fluorescence, or a low molecular weight compound or a polymer compound which emits phosphorescence may be used. In the present invention, in the case that a base layer on which the light emitting layer is provided is the positive hole injection transport layer of the present invention, the positive hole injection transport layer forms the charge transfer complex and is likely to be insoluble in a nonaqueous solvent such as xylene or the like used for the solution applying method, therefore, as the material for the light emitting layer, it is possible to use the polymer material which can be easily soluble in the nonaqueous solvent such as xylene or the like and forms a layer by the solution applying method. In this case, a polymer compound which emits fluorescence, a polymer compound containing a low molecular weight compound which emits fluorescence, a polymer compound which emits phosphorescence, or a polymer compound containing a low molecular weight compound which emits phosphorescence can be suitably used.

The light emitting layer can be formed of the emitting material by the solution applying method, vapor deposition method or transfer method. A solution applying method similar to that in "Method for producing device" that will be described hereinafter can be used. The vapor deposition method, for example, a vacuum vapor deposition method is a method comprising the steps of: charging a material of the light emitting layer in a crucible disposed in a vacuum container; evacuating the inside of the vacuum container to about 10-4 Pa by means of an appropriate vacuum pump; heating the crucible to evaporate the material of the light emitting layer; and then forming light emitting layer 100 on a laminate, in which substrate 50, electrode 61, positive hole injection transport layer 70, and positive hole transport layer 90a are laminated, which is disposed at a position facing the crucible.

The transfer method is a method, for example, that the light emitting layer formed on a film in advance by the solution applying method or vapor deposition method is attached on positive hole injection transport layer 70 provided on the electrode, and light emitting layer 100 is transferred on positive hole injection transport layer 70 by heating. In addition, the positive hole injection transport layer side of a laminate in which the film, light emitting layer 100, and positive hole injection transport layer 70 are laminated in this order may be transferred on the electrode.

The thickness of the light emitting layer is generally from about 1 to 500 nm, preferably from about 20 to 1,000 nm. In the present invention, the positive hole injection transport layer is suitably formed by the solution applying method, therefore, there is an advantage of being able to reduce the process cost in the case that the light emitting layer is also formed by the solution applying method.

(Organic Transistor)

As another embodiment of the device of the present invention, an organic transistor can be exemplified. Hereinafter, layers constituting the organic transistor will be described using FIGS. 6 and 7.

In the organic transistor of the present invention as shown in FIG. 6, positive hole injection transport layer 70 is formed on the surfaces of electrode 61 (source electrode) and electrode 62 (drain electrode) so that positive hole injection transport property between electrode 61 and the organic semiconductor layer, and electrode 62 and the organic semiconductor becomes high, and film stability of the positive hole injection transport layer of the present invention is high. Thereby, it contributes to the achievement of the long driving lifetime.

In the organic transistor of the present invention, as shown in FIG. 7, positive hole injection transport layer 70 of the present invention may function as organic semiconductor layer 110.

In addition, in the organic transistor of the present invention, as shown in FIG. 6, positive hole injection transport layer 70 may be formed on the surfaces of electrode 61 (source electrode) and electrode 62 (drain electrode), and positive hole injection transport layer 70 of the present invention, which is made of a different material from that of the positive hole injection transport layer formed on the surface of the electrode may be further formed as the organic semiconductor layer 110.

In the case that the organic transistor as shown in FIG. 6 is formed, as the material which forms the organic semiconductor layer, a low molecular or polymer organic semiconductor material having a donating property (p type) can be used.

As the organic semiconductor material, examples to be used include porphyrin derivatives, arylamine derivatives, polyacene derivatives, perylene derivatives, rubrene derivatives, coronene derivatives, perylene tetracarboxylic acid diimide derivatives, perylene tetracarboxylic dianhydride derivatives, polythiophene derivatives, poly p-phenylene derivatives, poly p-phenylenevinylene derivatives, polypyrrole derivatives, polyaniline derivatives, polyfluorene derivatives, polythiophenevinylene derivatives, polythiophene-heterocyclic aromatic copolymers and derivatives thereof; α-6-thiophene, α-4-thiophene; oligoacene derivatives such as naphthalene; oligothiophene derivatives of α-5-thiophene, etc.; pyromellitic dianhydride derivatives; and pyromellitic diimide derivatives.

Examples of the porphyrin derivatives include metalphthalocyanine such as phthalocyanine and copper phthalocyanine.

Examples of the arylamine derivatives include m-TDATA.

Examples of the polyacene derivatives include naphthalene, anthracene, naphthacene, and pentacene.

In addition, there can be used a layer having improved conductive property by mixing Lewis acid, tetrafluoro tetracyanoquinodimethane ($F_4$-TCNQ), an inorganic oxide such as vanadium or molybdenum with any of the porphyrin derivatives and triphenylamine derivatives.

Even in the case of forming the organic transistor comprising the positive hole injection transport layer of the present invention as shown in FIG. 6, as a compound constituting the organic semiconductor layer 110, it is preferable to use the positive hole transport compound, in particular, the positive hole transport polymer compound is used for the positive hole injection transport layer of the present invention, from the viewpoint of improving the stability of adhesion to the interface between the positive hole injection transport layer 70 of the present invention and the organic semiconductor layer 110, and contributing to the achievement of the long driving lifetime.

It is preferable that carrier mobility of the organic semiconductor layer is $10^{-6}$ cm/Vs or more, particularly for the organic transistor, $10^{-3}$ cm/Vs or more is preferable from the viewpoint of transistor property.

In addition, the organic semiconductor layer can be formed by the solution applying method or a dry process similarly as the light emitting layer of the organic EL element.

The substrate, the gate electrode, the source electrode, the drain electrode and the insulating layer may not be particularly limited and can be formed by using the following materials.

Substrate 50 is a support medium of the device of the present invention. The material of the substrate may be, for example, a flexible material or a hard material. Specifically, a similar material to that of "Substrate" of the organic EL element can be used.

The material of the gate electrode, source electrode and drain electrode is not particularly limited if it is a conductive material. However, it is preferable that the material is a metal or a metal oxide from the viewpoint of forming positive hole injection transport layer 70 wherein the coordination compound containing the metal ion is adsorbed using the charge transport material of the present invention. Specifically, a similar metal or metal oxide to that of the electrode of the organic EL element can be used, particularly, platinum, gold, silver, copper, aluminum, indium, ITO and carbon are preferable.

For the insulating layer which insulates the gate electrode, various kinds of insulating materials can be used. Also, either an inorganic oxide or an organic compound can be used, particularly, an inorganic oxide having high relative permittivity is preferable. Examples of the inorganic oxide include silicon oxide, aluminum oxide, tantalum oxide, titanium oxide, tin oxide, vanadium oxide, barium strontium titanate, barium zirconate titanate, lead zirconate titanate, lead lanthanum titanate, strontium titanate, barium titanate, barium magnesium fluoride, bismuth titanate, strontium bismuth titanate, strontium bismuth tantalate, bismuth niobate tantalate, and yttrium trioxide. Among the above, silicon oxide, aluminum oxide, tantalum oxide and titanium oxide are preferable. Also, an inorganic nitride such as silicon nitride, or aluminum nitride can be suitably used.

As the organic compound, a polyimide, a polyamide, a polyester, a polyarylate, a photoradical polymerizable or photocationic polymerizable photocurable resin, a copolymer containing an acrylonitrile component, a polyvinylphenol, a polyvinylalcohol, a novolak resin, cyanoethylpullulan, or a phosphazene compound containing a polymer or an elastomer can be used.

Other constitutions of other organic devices such as a dye-sensitized solar battery, an organic thin film solar battery and an organic semiconductor, an oxide compound solar battery and a quantum dot light emitting element having the positive hole injection transport layer are not particularly limited as long as the above positive hole injection transport layer is the positive hole injection transport layer of the present invention, and may be the same as a known constitution.

(Method for Producing Device)

The first method for producing the device of the present invention is a method for producing a device comprising the substrate, two or more electrodes facing each other disposed on the substrate and the positive hole injection transport layer disposed between two electrodes among the two or more electrodes comprising: the formation step of forming the positive hole injection transport layer on any of the electrodes or on any of layers on the electrodes using the first ink for the positive hole injection transport layer.

The second method for producing the device of the present invention is a method for producing a device comprising the substrate, two or more electrodes facing each other disposed on the substrate and the positive hole injection transport layer disposed between two electrodes among the two or more electrodes comprising: the formation step of forming the positive hole injection transport layer on any of the electrodes or on any of layers on the electrodes using the second ink for the positive hole injection transport layer; and the oxidation step of oxidizing the compounds (C).

In the method for producing the device of the present invention, the positive hole injection transport layer containing the nanoparticle is formed of the first or second ink for the positive hole injection transport layer by the solution applying method as described above. Since the solution applying method does not require a vapor deposition apparatus and can separately coat materials without using a mask vapor deposition or the like upon forming the positive hole injection transport layer, it is possible to form a device having a high productivity and the stability of adhesion of the interface between the electrode and positive hole injection transport layer, and between the positive hole injection transport layer and organic layer.

The solution applying method used herein means a method for applying the first or second ink for the positive hole injection transport layer on the electrode or on the layer being a base layer, and drying the ink to form the positive hole injection transport layer.

Examples of the solution applying method include a dipping method, a spray coating method, a spin coating method, a blade coating method, a dip coating method, a cast method, a roll coating method, a bar coating method, a die-coating method, and a liquid dropping method such as an ink-jet method. In the case of forming a monomolecular film, the dipping method or the dip coating method is suitably used.

The second method for producing the device of the present invention comprises the oxidation step of oxidizing one or more kinds of the compounds (C) selected from the group consisting of the transition metal carbide, transition metal nitride and transition metal sulfide contained in the ink for the positive hole injection transport layer, thereby, it is possible to form a layer containing a transition metal oxide which does not have solvent solubility not using the vapor deposition method but using the solution applying method. In addition, it is possible to change positive hole injection transport property appropriately while the adhesion to the adjacent organic layer is kept by oxidizing the compounds (C) in the positive hole injection transport layer to produce the corresponding oxide of transition metal carbide, transition metal nitride or transition metal sulfide. Furthermore, it is possible to improve film strength by having the oxidation step.

In the second method for producing the device of the present invention, the oxidation step of oxidizing the compounds (C) may be performed before the formation step of forming the positive hole injection transport layer, or after the formation step of forming the positive hole injection transport layer.

That is, as one embodiment of the second method for producing the device of the present invention, a method comprising: the formation step of forming the positive hole injection transport layer containing one or more kinds of the compounds (C) selected from the group consisting of the transition metal carbide, transition metal nitride and transition metal sulfide, and the protecting agent on any of the electrodes or on any of layers on the electrodes; and the oxidation step of oxidizing the compounds (c) in the positive hole injection transport layer to produce the transition metal carbide oxide, transition metal nitride oxide or transition metal sulfide oxide, respectively, can be exemplified. By using the above method, the positive hole injection transport layer containing the nanoparticle can be formed.

As another embodiment of the second method for producing the device of the present invention, a method comprising: the oxidation step of oxidizing one or more kinds of the compounds (C) selected from the group consisting of the transition metal carbide, transition metal nitride and transition metal sulfide contained in the second ink for the positive hole injection transport layer to produce a nanoparticle before the formation step of forming the positive hole injection transport layer, can be exemplified. The positive hole injection transport layer containing the nanoparticle is formed of the oxidized ink for the positive hole injection transport layer. After the layer is formed, another oxidation step may be further performed.

As for other processes in the method for producing the device, a known process can be appropriately used.

EXAMPLES

Hereinafter, the present invention will be explained further in detail with reference to examples. The scope of the present invention is not limited to the following examples. The thickness of a layer or film is an average film thickness.

Synthesis Example 1

In a 25 ml three-neck flask, 0.8 g of n-hexadecylamine (manufactured by: KANTO CHEMICAL CO., LTD.) as a protecting agent and 12.8 g of dioctyl ether (manufactured by: TOKYO CHEMICAL INDUSTRY CO., LTD.) were weighed and charged. The pressure in the flask was reduced while agitating, and the flask was left at room temperature (24° C.) for 1 hour to remove a low-volatility Volatility component. The atmosphere was changed from the vacuum atmosphere to air atmosphere, and 0.8 g of molybdenum hexacarbonyl (manufactured by: KANTO CHEMICAL CO., LTD.) was added therein. Thus obtained mixture was heated to 280° C. while agitating under an argon gas atmosphere. The temperature thereof was kept for 1 hour. Then, after cooling the mixture to room temperature (24° C.) and changing the atmosphere from the argon gas atmosphere to air atmosphere, 20 g of ethanol was added dropwise. Next, a precipitate was separated from the reaction solution by centrifugation followed by performing purification by reprecipitation by the process described below.

That is, the precipitate was mixed with 3 g of chloroform to produce a dispersion, and 6 g of ethanol was added dropwise to the dispersion, thus, a purified precipitate was obtained.

Thus obtained reprecipitate solution was subjected to centrifugation to separate the precipitate from the reaction solution followed by drying, thus, black powder of Synthesis example 1 was obtained.

Synthesis Example 2

In a 25 ml three-neck flask, 3.2 g of dioctyl ether (manufactured by: TOKYO CHEMICAL INDUSTRY CO., LTD.) was weighed and charged. The pressure in the flask was reduced while agitating, and the flask was left at room temperature (24° C.) for 1.5 hours to remove a low-volatility component. The atmosphere was changed from the vacuum atmosphere to air atmosphere, and 0.2 g of molybdenum hexacarbonyl (manufactured by: KANTO CHEMICAL CO., LTD.) and 0.4 g of 4,4,5,5,6,6,7,7,8,8,9,9,10,10,11,11,11-heptadecafluoroundecylamine (manufactured by: Fluka) as a protecting agent were added therein. Thus obtained mixture was heated to 250° C. while agitating under an argon gas atmosphere. The temperature thereof was kept for 1 hour. Then, after cooling the mixture to room temperature (24° C.) and changing the atmosphere from the argon gas atmosphere to air atmosphere, 5 g of ethanol was added therein. Next, a precipitate was separated from the reaction solution by centrifugation followed by washing thus obtained precipitate with chloroform and ethanol to dry. Thus, black powder of Synthesis example 2 was obtained.

Synthesis Example 3

In a 25 ml three-neck flask, 6.4 g of dioctyl ether (manufactured by: TOKYO CHEMICAL INDUSTRY CO., LTD.) was weighed and charged. The pressure in the flask was reduced while agitating, and the flask was left at room temperature (24° C.) for 2.5 hours to remove a low-volatility component. The atmosphere was changed from the vacuum atmosphere to air atmosphere, and 0.4 g of molybdenum hexacarbonyl (manufactured by: KANTO CHEMICAL CO., LTD.) and 0.9 g of 4-(3,3,4,4,5,5,6,6,7,7,8,8,9,9,10,10,10-heptadecafluorodecyl)benzylamine (manufactured by: Aldrich) as a protecting agent were added therein. Thus obtained mixture was heated to 250° C. while agitating under an argon gas atmosphere. The temperature thereof was kept for 1 hour. Then, after cooling the mixture to room temperature (24° C.) and changing the atmosphere from the argon gas atmosphere to air atmosphere, 10 g of ethanol was added therein. Next, a precipitate was separated from the reaction solution by centrifugation followed by washing thus obtained precipitate with chloroform and ethanol to dry. Thus, black powder of Synthesis example 3 was obtained.

Synthesis Example 4

In a 50 ml three-neck flask, 0.2 g of sulfur (manufactured by: Aldrich), 0.7 g of n-hexadecylamine (manufactured by: KANTO CHEMICAL CO., LTD.) as a protecting agent, and 12.8 g of dioctyl ether (manufactured by: TOKYO CHEMICAL INDUSTRY CO., LTD.) were weighed and charged. The pressure in the flask was reduced while agitating, and the flask was left at room temperature (24° C.) for 3 hours to remove a low-volatility component. The atmosphere was changed from the vacuum atmosphere to air atmosphere, and 0.8 g of molybdenum hexacarbonyl (manufactured by: KANTO CHEMICAL CO., LTD.) was added therein. Thus obtained mixture was heated to 280° C. while agitating under an argon gas atmosphere. The temperature thereof was kept for 1 hour. Then, after cooling the mixture to room temperature (24° C.) and changing the atmosphere from the argon gas atmosphere to air atmosphere, 20 g of ethanol was added therein. Next, a precipitate was separated from the reaction solution by centrifugation followed by washing thus obtained precipitate with chloroform and ethanol to dry. Thus, black powder of Synthesis example 4 was obtained.

Synthesis Example 5

In a 50 ml three-neck flask, 0.8 g of 4-(aminomethyl) biphenyl (manufactured by: Aldrich) as a protecting agent and 12.8 g of dioctyl ether (manufactured by: TOKYO CHEMICAL INDUSTRY CO., LTD.) were weighed and charged. The pressure in the flask was reduced while agitating, and the flask was left at room temperature (24° C.) for 2 hours to remove a low-volatility component. The atmosphere was changed from the vacuum atmosphere to air atmosphere, and 0.8 g of molybdenum hexacarbonyl (manufactured by: KANTO CHEMICAL CO., LTD.) was added therein. Thus obtained mixture was heated to 280° C. while agitating under an argon gas atmosphere. The temperature thereof was kept for 1 hour. Then, after cooling the mixture to room temperature (24° C.) and changing the atmosphere from the argon gas atmosphere to air atmosphere, 20 g of ethanol was added dropwise. Next, a precipitate was separated from the reaction solution by centrifugation followed by performing purification by reprecipitation by the process described below.

That is, the precipitate was mixed with 5 g of chloroform to produce a dispersion, and 15 g of ethanol was added dropwise to the dispersion, thus, a purified precipitate was obtained.

Thus obtained reprecipitate solution was subjected to centrifugation to separate the precipitate from the reaction solution followed by drying, thus, black powder of Synthesis example 5 was obtained.

Comparative Synthesis Example 1

(Production of $MoO_3$ Slurry)

In a paint shaker, 0.3 g of $MoO_3$ powder was mixed with 30 g of toluene solvent and zirconia beads having a diameter of 3 mm, and dispersed in the solvent while performing physical pulverization to obtain a toluene dispersion of $MoO_3$. Next, the dispersion was dispersed with zirconia beads having a diameter of 0.3 mm for 48 hours, and the supernatant of the dispersion was filtered using a filter having a thickness of 0.2 μm to produce a $MoO_3$ slurry.

(Measurement of Particle Diameter)

The particle diameter of the black powder obtained in each of Synthesis examples 1, 4 and 5, and the particle diameter of the $MoO_3$ powder obtained in Comparative synthesis example 1 were measured by a dynamic light scattering method. The measurement was performed by means of a dynamic light scattering measurement apparatus (product name: Nanotrac Particle Size Analyzer UPA-EX150; manufactured by: NIKKISO CO., LTD.). As a measurement sample, a solution in which powder which is subject to the measurement was dispersed in chloroform (concentration: 4.6 mg/ml) was used.

Figure 8:
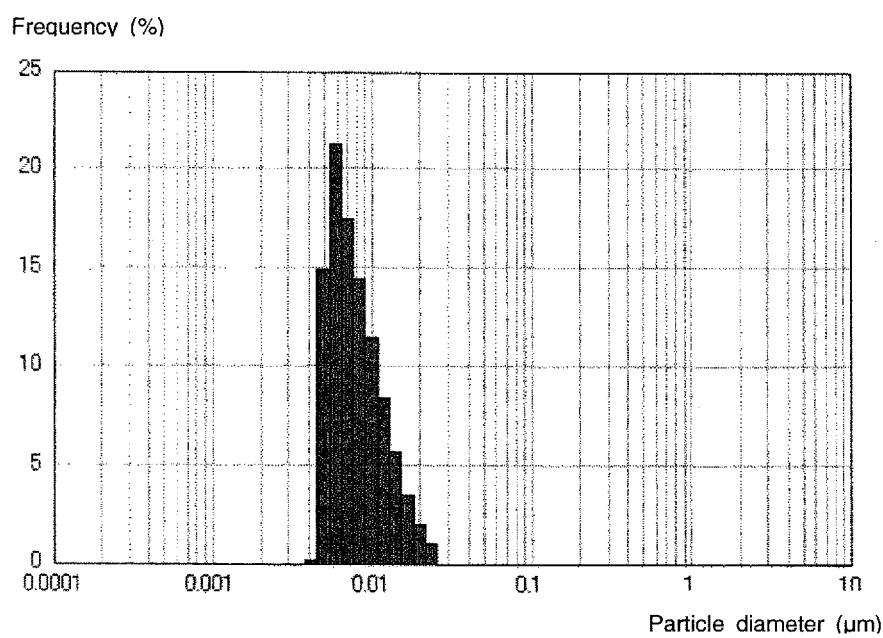
FIG. 8 is a view showing a result of measuring the particle diameter of the transition metal compound-containing nanoparticle.

The number average particle size of the black powder obtained in Synthesis example 1 was 6.2 nm. The measurement result of Synthesis example 1 is shown in FIG. 8.

The number average particle size of the black powder obtained in Synthesis example 4 was 10.5 nm.

The number average particle size of the black powder obtained in Synthesis example 5 was 5.6 nm.

In addition, the number average particle size of the $MoO_3$ particle obtained in Comparative synthesis example 1 was 18.3 nm.

The average particle diameter of the black powder obtained in each of Synthesis examples 1, 2 and 3 was measured by means of an ultra-high resolution scanning electron microscope (product name: S-4800; manufactured by: Hitachi High-Technologies Corporation). The measurement sample was produced by adding dropwise a few of the solution in which the black powder was dispersed on a commercially-available microgrid with a support film and drying the solvent under reduced pressure. The particle image was observed in a Scanning Transmission Electron Microscope (STEM) mode. The mean value of the brightly observed 20 particles was defined as an average particle diameter.

The particle diameter of the black powder produced in Synthesis example 1 was about 4 nm. This value was smaller than that measured by the dynamic light scattering method. However, it can be considered that the observed particle diameter was an average particle diameter of the nanoparticle excluding the protecting agent.

The particle diameter of the black powder produced in Synthesis example 2 was about 7 nm.

The particle diameter of the black powder produced in Synthesis example 3 was about 9 nm.

(Measurement of Crystal Structure)

The crystal structure of the black powder obtained in each of Synthesis examples 1 to 3 and 5 was identified by the X-ray Diffraction method. As the measurement apparatus, RTNT-1500 (product name; manufactured by: Rigaku Corporation) was used, and a measurement sample was produced by placing the black powder which is subject to the measurement on a glass. As X-ray source, CuKα X-ray was used. The measurement was performed under tube voltage of 50 kV and tube current of 250 mA. The measurement was also performed by 2θ/θ scanning method under scanning rate of 2° per minute and step angle of 0.05°.

In the black powder obtained in each of Synthesis examples 1 to 3 and 5, sharp peaks were observed at 2θ=37.8, 43.7, 63.4, 75.7, and 79.9°. It can be understood from the value in the database JCPDS card No. 15-0457 that the produced black powder comprises particles consisting mainly of $Mo_2C$ or $MoC$. On the other hand, in the Mo slurry obtained in Comparative synthesis example 1, the peak exhibiting molybdenum trioxide ($MoO_3$) was obtained.

(Measurement of Valence)

The valence of Samples 1 to 4 described below was measured by X-ray photoelectron spectroscopy (XPS). The measurement was performed by means of ESCA-3400 (product name; manufactured by: Kratos). As X-ray source used for the measurement, MgKα X-ray was used. The measurement was performed under accelerating voltage of 10 kV and filament current of 20 mA, without using a monochromator.

(Sample 1: $MoO_3$ Film)

Blue-white $MoO_3$ powder (manufactured by: Furuuchi Chemical Corporation) was deposited on a glass substrate with Indium Tin Oxide (ITO) by a resistance heating under vacuum condition (pressure: $1 \times 10^{-4}$ Pa), thereby forming a $MoO_3$ film having a thickness of 20 nm.

Thus obtained vapor-deposited film was measured by the XPS method, and the only spectrum attributed to 3d 5/2 of $MoO_3$ including molybdenum (Mo) having an oxidation number of +6 was observed.

(Sample 2: Film Formed of Black Powder of Synthesis Example 2)

As a measurement sample, an ink was produced by dissolving the black powder of Synthesis example 2 in cyclohexanone in a concentration of 0.4% by weight in the air. The ink was applied on an ITO glass substrate using a spinner in the air, thus, a thin film was formed. The thin film was dried at 200° C. for 30 minutes in the air. The thickness of the thin film after drying was 10 nm.

The thin film after drying was measured by the XPS method, and the spectrum attributed to 3d 5/2 of $MoO_3$ was observed at the peak position of 232.5 eV.

Furthermore, comparing the spectrum with Sample 1 described above, not only the peak of $MoO_3$ including Mo having an oxidation number of +6 was observed but also the peak which is presumed as Mo having an oxidation number of +5 was observed as a shoulder around 231.2 eV.

In addition, the spectrum attributed to F1s of the fluoroalkyl group in the protecting agent of the thin film was observed in the vicinity of 687 eV, and the spectrum attributed to C is of the molybdenum carbide and C is of the fluoroalkyl group was observed around 284 to 285 eV.

The thin film was subjected to sputtering using argon gas so that about 5 nm from the surface of the thin film was removed. The peak attributed to $MoO_2$ including Mo having an oxidation number of +4 was observed, and the peak attributed to $MoO_2$ including Mo having an oxidation number of 0 was not observed. Sputtering was repeatedly performed until ITO being the base was able to be seen, however, the peak attributed to Mo having an oxidation number of 0 was not observed.

It is clear from the particle diameter measurement result that the particle diameter of the powder of Synthesis example 2 was about 7 nm. The thickness of the thin film (10 nm) was less than the total diameter of two of the particles of the powder of Synthesis example 2. Furthermore, the sputtering of about 5 nm was performed. Based on these facts, the elemental composition of the inside of the particles of Synthesis example 2 can be understood from the XPS measurement. This XPS result shows that Mo having an oxidation number of +4 which existed inside of the particles of the powder in Synthesis example 2 surfaced by sputtering. It can be understood from the above result that Mo having an oxidation number of +4 is contained in the inside of the nanoparticles in Synthesis example 2.

It is presumed from the measurement result of the crystal structure and the above XPS measurement result that the particle of Synthesis example 2 is a transition metal compound-containing nanoparticle, that is, a nanoparticle of the molybdenum carbide oxide, which has a shell structure in which the surface is made of the molybdenum carbide oxide having a valence of +6, and the inside of the surface is made of the molybdenum carbide oxide having a valence of +4.

(Sample 3: Film Formed of Black Powder of Synthesis Example 4)

A thin film having a thickness of 10 nm after drying was formed similarly as in Sample 2 except that the black powder in Synthesis example 4 was used instead of the black powder in Synthesis example 3 in the formation of the thin film of Sample 2.

The measurement of the thin film after drying was performed by the XPS method, and the spectrum attributed to 2p of S was observed at the peak position of around 162.5 eV in addition to 3d 5/2 of Mo. The spectrum of sulfur itself was observed at high energy side of around 163.5 eV, therefore, it is presumed that sulfur is bonded to molybdenum, so that the peak was chemically shifted.

Therefore, it is presumed that the particle of Synthesis example 4 was a transition metal compound-containing nanoparticle, that is, a nanoparticle containing the molybdenum sulfide oxide.

(Sample 4: Film Obtained by Performing Photocatalytic Treatment on Film Formed of Black Powder in Synthesis Example 2)

The thin film of Sample 4 having a thickness of 10 nm was formed similarly as in Sample 2 except that the thin film of Sample 2 was subjected to a photocatalytic treatment.

The measurement of the thin film was performed by the XPS method, and the spectrum attributed to F1s was not observed. However, the spectrum attributed to 3d 5/2 of Mo and C1s of molybdenum carbide was observed. The reason thereof is presumed that the fluoroalkyl group in the particle of Synthesis example 2 was decomposed by the photocatalytic treatment, however, carbon atom of the molybdenum carbide was not decomposed since it was firmly bonded to the molybdenum atom.

(Measurement of film thickness)

The film thickness was measured by the following steps: a single layer was formed with the material to be measured on a cleaned glass substrate with ITO; difference in height was made on the substrate using a cutter knife; and the difference in height was measured in a tapping mode by means of a probe microscope (product name: Nanopics 1000; manufactured by: SII NanoTechnology Inc.).

(Measurement of Ionization Potential)

As a value of ionization potential in the present invention, a value of work function measured by means of a Photoelectron Spectroscopy measurement apparatus (product name: AC-1; manufactured by: RIKEN KEIKI Co., Ltd.) was used. The measurement was performed by the following steps: a single layer was formed with a material to be measured on a cleaned glass substrate with ITO (manufactured by: Sanyo vacuum industries Co., Ltd.); and the energy value of emitted photoelectron was determined by means of the Photoelectron Spectroscopy measurement apparatus (product name: AC-1). The measurement was performed under the condition of 50 nW light intensity, at 0.05 eV intervals.

Example 1

On a glass substrate, a transparent anode, a laminate of a layer containing a molybdenum carbide oxide containing nanoparticle and a layer containing a positive hole transport compound as a positive hole injection transport layer, a positive hole transport layer, a light emitting layer, a positive hole block layer, an electron injection layer, and a cathode were formed as layers in this order and laminated. Then, sealing was finally performed to produce an organic EL element. The layers except the transparent anode and the positive hole injection transport layer were formed in a nitrogen purged glove box with water concentration of 0.1 ppm or less and oxygen concentration of 0.1 ppm or less.

Firstly, a thin film (thickness: 150 nm) of Indium Tin Oxide (ITO) was used as the transparent anode. A glass substrate with ITO (manufactured by: Sanyo vacuum industries Co., Ltd.) was subjected to patterning in the form of stripe. The ITO substrate subjected to patterning was subjected to ultrasonic cleaning using a neutral detergent and ultrapure water in this order followed by UV-ozonation. HOMO of ITO after performing UV-ozonation was 5.0 eV.

Next, the molybdenum carbide oxide-containing nanoparticle obtained in Synthesis example 1 described above was dissolved in cyclohexanone in a concentration of 0.4% by weight to prepare an ink for a positive hole injection transport layer.

Then, the ink for the positive hole injection transport layer was applied on a cleaned anode by a spin coating method to form a positive hole injection transport layer containing the nanoparticle. After applying the ink for the positive hole injection transport layer, the positive hole injection transport layer was dried at 200° C. for 30 minutes using a hot plate to evaporate the solvent. The thickness of the positive hole injection transport layer after drying was 10 nm.

Next, on thus produced positive hole injection transport layer, a thin film (thickness: 10 nm) of polyvinylcarbazole (PVK) (manufactured by: Aldrich) was formed by application as a positive hole transport layer. The weight-average molecular weight of PVK is 110,000. A solution in which PVK was dissolved in dichloroethane being a solvent in a concentration of 0.5% by weight was filtered using a filter having a thickness of 2 μm, and the positive hole transport layer was formed by applying the solution by a spin coating method. After applying the PVK solution, the positive hole transport layer was dried at 150° C. for 30 minutes using a hot plate to evaporate the solvent.

Then, on thus formed positive hole transport layer, a mixed thin film containing tris[2-(p-tolyl)pyridine)]iridium (III)(Ir (mppy)$_3$) as a luminescent dopant and 4,4'-bis(2,2-carbazole-9-yl)biphenyl (CBP) as a host was formed by application as a light emitting layer. The light emitting layer was formed by applying a solution in which CBP in a concentration of 1% by weight and Ir(mppy)$_3$ in a concentration of 0.05% by weight were dissolved in toluene being a solvent by a spin coating method. After applying the ink, the light emitting layer was dried at 100° C. for 30 minutes using a hot plate to evaporate the solvent.

Next, on thus obtained light emitting layer, a thin film of bis(2-methyl-8-quinolinato) (p-phenylphenolate) aluminum complex (BAlq) was formed by deposition as a positive hole block layer. The thin film of BAlq was formed under vacuum condition (pressure: $1\times10^{-4}$ Pa) by a resistance heating method so as to have a film thickness of 15 nm.

Next, on thus obtained positive hole block layer, a thin film of tris(8-quinolinato) aluminum complex (Alq3) was formed by deposition as an electron transport layer. The thin film of Alq3 was formed under vacuum condition (pressure: $1\times10^{-4}$ Pa) by a resistance heating method so as to have a film thickness of 15 nm.

Next, on thus produced electron transport layer, a film (thickness: 0.5 nm) of LiF as the electron injection layer and a film (thickness: 100 nm) of Al as the cathode were sequentially formed under vacuum condition (pressure: $1\times10^4$ Pa) by a resistance heating vapor deposition method.

Finally, after forming the cathode, the above layers were sealed in the glove box using alkali-free glass and a UV curable epoxy adhesive, thus, the organic EL element of Example 1 was produced.

Example 2

An organic EL element of Example 2 was produced similarly as in Example 1 except that the positive hole injection transport layer was formed using the nanoparticle of Synthesis example 2 instead of the nanoparticle of Synthesis example 1.

Example 3

An organic EL element of Example 3 was produced similarly as in Example 1 except that the positive hole injection transport layer was formed using the nanoparticle of Synthesis example 3 instead of the nanoparticle of Synthesis example 1.

Example 4

An organic EL element of Example 4 was produced similarly as in Example 1 except that the positive hole injection transport layer was formed using the nanoparticle of Synthesis example 4 instead of the nanoparticle of Synthesis example 1.

Example 5

An organic EL element of Example 5 was produced similarly as in Example 1 except that the positive hole injection transport layer was formed using the nanoparticle of Synthesis example 5 instead of the nanoparticle of Synthesis example 1.

Example 6

An organic EL element of Example 6 was produced similarly as in Example 2 except that the positive hole injection transport layer was subjected to a photocatalytic treatment. The photocatalytic treatment was performed by exposing the positive hole injection transport layer to light through a photomask with a photocatalyst-containing layer.

The photomask with the photocatalyst-containing layer was prepared as follows. A photomask having a transmission region and light shielding region on a substrate made of quart was prepared. On thus prepared photomask, a coating solution for the photocatalyst-containing layer comprising the following compositions was applied by a spin coater, and a heat drying was performed at 150° C. for 10 minutes followed by proceeding a hydrolytic polycondensation reaction to cure, thus, a transparent photocatalyst-containing layer having a thickness of 100 nm was formed, in which the photocatalyst was firmly immobilized in organosiloxane.
(Coating Solution for Photocatalyst-Containing Layer)
Titanium dioxide (product name: ST-K01; manufactured by: ISHIHARA SANGYOKAISHA, LTD.): 2 parts by weight
Organoalkoxysilane (product name: TSL8113; manufactured by: GE Toshiba Silicones Co., Ltd.): 0.4 parts by weight
Isopropyl alcohol: 3 parts by weight Next, the positive hole injection transport layer was exposed to light through the above prepared photomask with the photocatalyst-containing layer to form a pattern consisting of a lyophilic region and a liquid-repellent region. Using an ultraviolet exposure apparatus equipped with a high pressure mercury lamp and a positioning mechanism for positioning the photomask with a photocatalyst-containing layer and the substrate, the distance between the photocatalyst-containing layer of the photomask with the photocatalyst-containing layer and the positive hole injection layer was adjusted so as to be 100 μm, and then the photomask with the photocatalyst-containing layer was exposed to light for 3 minutes from the back side of the photomask so that the exposure amount of the light in the wavelength of 254 nm was 5 J/cm$^2$.

Example 7

An element was produced similarly as in Example 6 except that the positive hole injection transport layer was directly exposed to vacuum-ultraviolet light as a light source for exposure without using the mask with photocatalyst instead of using ultraviolet light in the wavelength of 253 nm. At this time, the positive hole injection transport layer was exposed to vacuum-ultraviolet light in the wavelength of 172 nm so that the exposure amount of the light was 5 J/cm$^2$.

Comparative Example 1

An organic EL element of Comparative example 1 was produced similarly as in Example 1 except that a thin film (thickness: 10 nm) of molybdenum oxide ($MoO_3$) was formed instead of forming the positive hole injection transport layer.

The thin film of $MoO_3$ was formed under vacuum condition (pressure: $1\times10^{-4}$ Pa) by a resistance heating vapor deposition method.

Comparative Example 2

An organic EL element of Comparative example 2 was produced similarly as in Example 1 except that the positive hole injection transport layer was formed by applying the slurry produced in Comparative synthesis example 1. The solid content of the slurry in Comparative synthesis example 1 was unknown, however, the positive hole injection transport layer was formed by applying the slurry by the spin coating method, and the thickness of the positive hole injection transport layer was measured after applying the slurry, which was about 10 nm. After applying the solution, the positive hole injection transport layer was dried at 100° C. for 10 minutes using a hot plate to evaporate the solvent. Thereby, it slightly became clouded. The produced element emitted green light derived from Ir(mppy)$_3$, and it was prone to short out.

The organic EL element produced in each of Examples and Comparative examples was driven at 10 mA/cm², and the luminance and spectrum were measured by means of a spectroradiometer (product name: SR-2; manufactured by: TOPCON CORPORATION). The organic EL element produced in each of Examples and Comparative examples emitted green light derived from Ir(mppy)$_3$. The measurement results are shown in Table 1. The electric current efficiency was calculated from the driving current and luminance.

The lifetime property of the organic EL element was evaluated by observing luminance which was gradually decreasing over time in a constant current driving. Herein, time (hr.) until the retention of luminance decreases to 50% with respect to the initial luminance of 1,000 cd/m² was determined as a lifetime (LT 50).

TABLE 1

| | Positive hole injection transport layer (film thickness) | Ionization potential (eV) | Applied voltage (V) *1 | Electric current efficiency (cd/A) | Elapsed time (hr.) LT 50 *2 |
|---|---|---|---|---|---|
| Example 1 | Mo carbide oxide-containing nanoparticle of Synthesis example 1 (10 nm) | 5.0 | 10.3 | 4.7 | 45 |
| Example 2 | Mo carbide oxide-containing nanoparticle of Synthesis example 2 (10 nm) | 5.4 | 10.0 | 5.5 | 45 |
| Example 3 | Mo carbide oxide-containing nanoparticle of Synthesis example 3 (10 nm) | 5.4 | 10.0 | 5.5 | 40 |
| Example 4 | Mo sulfide oxide-containing nanoparticle of Synthesis example 4 (10 nm) | 5.1 | 10.1 | 5.5 | 47 |
| Example 5 | Mo carbide oxide-containing nanoparticle of Synthesis example 5 (10 nm) | 5.2 | 10.0 | 5.6 | 50 |
| Example 6 | Film obtained by performing photocatalytic treatment on Mo carbide oxide-containing nanoparticle (10 nm) of Synthesis example 2 | 5.6 | 9.8 | 5.6 | 52 |
| Example 7 | Film obtained by performing vacuum-ultraviolet light exposure on Mo carbide oxide-containing nanoparticle (10 nm) of Synthesis example 2 | 5.5 | 9.9 | 5.5 | 47 |
| Comparative example 1 | $MoO_3$ vapor-deposited film (10 nm) | 5.64 | 10.0 | 5.2 | 33 |
| Comparative example 2 | Mo slurry produced in Comparative synthesis example 1 (estimated 10 nm) | 5.64 | 10.3 | 3.8 | 21 |

*1 Applied voltage upon driving at 10 mA/cm²
*2 Elapsed time at retention of 50% in a constant current driving initiated at initial luminance of 1,000 cd/m²

(Results)

Comparing the element of Example 1 with the elements of Comparative examples 1 and 2, the element of Example 1 had a longer lifetime and better driving stability than those in the elements of Comparative examples 1 and 2. The reasons thereof are assumed that the ionization potential of the molybdenum carbide oxide was more appropriate than the $MoO_3$ vapor-deposited film and the film formed of the $MoO_3$ slurry, or the affinity and adhesion with the organic substance increased by including carbon atom instead of a simple oxide, and thus this contributed to extending the lifetime.

Furthermore, in the element of Comparative example 2 using the $MoO_3$ slurry, dispersibility of the ink was poor, the positive hole injection transport layers were likely to be aggregated, and the element was prone to short out. It can be understood that the molybdenum carbide oxide of the present invention was more excellent in also dispersibility than the $MoO_3$ slurry.

Comparing the elements of Examples 2 and 3 with the element of Example 1, the elements of Examples 2 and 3 using the fluorinated compound in the protecting agent had higher ionization potential and lower driving voltage than that of Example 1. This result shows that the ionization potential was able to be controlled by changing the protecting agent to upgrade the element.

Comparing the element of Example 4 with the element of Example 1, the ionization potential was higher, the voltage of the element characteristics lowered, and the lifetime extended in the element of Example 4 using the molybdenum sulfide oxide than that of Example 1. This result shows that the ionization potential was able to be controlled by forming a composite with the compounds other than carbon to upgrade the element.

Comparing the element of Example 5 with the element of Example 1, the element of Example 5 using the protecting agent containing an aromatic ring in the organic group had lower driving voltage and longer lifetime than that of Example 1. The reason thereof is assumed that by changing the organic group of the protecting agent to an aromatic ring, electrical charge mobility was improved by n electron, ionization potential was increased, and glass transition temperature was increased, and thus the element was upgraded. The reason that the element of Example 5 had a longer lifetime than that of Example 3 is that the charge transport property was improved by connecting two or more aromatic rings.

Comparing the elements of Examples 6 and 7 with the element of Example 1, the positive hole injection transport layer subjected to oxidation treatment of Examples 6 and 7 had lower driving voltage and longer lifetime than that of Example 1. The reason thereof is assumed that the ionization potential was increased by appropriately oxidizing the positive hole injection transport layer and chemical stability was improved by appropriately oxidizing the surface layer of the nanoparticle, and thus the element was upgraded.

REFERENCE SIGNS LIST

1: transition metal compound-containing nanoparticle
10: transition metal and/or transition metal complex
20: transition metal carbide
30: protecting agent
40: transition metal carbide oxide
50: substrate
61, 62 and 63: electrode
70: positive hole injection transport layer
80: organic layer
90a: positive hole transport layer
90b: positive hole injection layer
100: light emitting layer
110: organic semiconductor layer
120: insulating layer

The invention claimed is:

1. A transition metal compound-containing nanoparticle comprising a transition metal compound containing one or more kinds selected from the group consisting of a transition metal carbide oxide, transition metal nitride oxide and transition metal sulfide oxide, wherein a protecting agent having a linking group and a hydrophobic organic group is connected to the transition metal compound by the linking group.

2. The transition metal compound-containing nanoparticle according to claim 1, wherein a transition metal in the transition metal compound is one or more kinds of metals selected from the group consisting of molybdenum, tungsten, vanadium and rhenium.

3. The transition metal compound-containing nanoparticle according to claim 1, wherein an average particle diameter of the transition metal compound-containing nanoparticle is 0.5 to 20 nm.

4. The transition metal compound-containing nanoparticle according to claim 1, wherein the organic group is an aromatic hydrocarbon and/or heterocyclic ring.

5. The transition metal compound-containing nanoparticle according to claim 1, wherein the protecting agent further contains a charge transport group.

6. The transition metal compound-containing nanoparticle according to claim 1, wherein the linking group is one or more kinds selected from functional groups represented by the following formulae (1-a) to (1-n):

[Chemical formula 1]

-continued

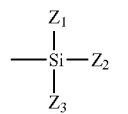  (1-j)

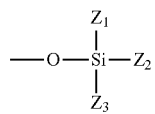  (1-k)

  (1-l)

  (1-m)

  (1-n)

wherein each of $Z_1$, $Z_2$ and $Z_3$ independently represents a halogen atom or an alkoxy group.

7. An ink for a positive hole injection transport layer comprising the transition metal compound-containing nanoparticle defined by claim 1, and an organic solvent.

8. A method for producing a device comprising a substrate, two or more electrodes facing each other disposed on the substrate and a positive hole injection transport layer disposed between two electrodes among the two or more electrodes comprising: a formation step of forming the positive hole injection transport layer on any of the electrodes or on any of layers on the electrodes using the ink for the positive hole injection transport layer defined by claim 7.

9. A device comprising a substrate, two or more electrodes facing each other disposed on the substrate and a positive hole injection transport layer disposed between two electrodes among the two or more electrodes, wherein the positive hole injection transport layer contains at least the transition metal compound-containing nanoparticle defined by claim 1.

10. The device according to claim 9, wherein the positive hole injection transport layer comprises two or more kinds of the transition metal compound-containing nanoparticles which have different kinds of the transition metal respectively.

11. The device according to claim 9, wherein the device is an organic EL element containing an organic layer at least having a light emitting layer.

* * * * *